(12) United States Patent
Youn et al.

(10) Patent No.: US 9,502,345 B2
(45) Date of Patent: Nov. 22, 2016

(54) BALL-GRID-ARRAY PACKAGE, ELECTRONIC SYSTEM AND METHOD OF MANUFACTURE

(75) Inventors: Sunpil Youn, Seoul (KR); Kwanyoung Oh, Gyeonggi-do (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 1774 days.

(21) Appl. No.: 12/705,846

(22) Filed: Feb. 15, 2010

(65) Prior Publication Data

US 2011/0037158 A1 Feb. 17, 2011

(30) Foreign Application Priority Data

Aug. 14, 2009 (KR) ........................ 10-2009-0075343

(51) Int. Cl.
*H01L 23/48* (2006.01)
*H01L 23/50* (2006.01)
(Continued)

(52) U.S. Cl.
CPC ............... *H01L 23/50* (2013.01); *H01L 24/33* (2013.01); *H01L 24/49* (2013.01); *H01L 24/73* (2013.01); *H01L 25/0657* (2013.01); *H01L 24/29* (2013.01); *H01L 24/48* (2013.01); *H01L 2224/05554* (2013.01); *H01L 2224/16145* (2013.01); *H01L 2224/16225* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/49112* (2013.01); *H01L 2224/49113* (2013.01); *H01L 2224/49171* (2013.01); *H01L 2224/49175* (2013.01); *H01L 2224/73265* (2013.01); *H01L 2225/0651* (2013.01); *H01L 2225/06513* (2013.01);
(Continued)

(58) Field of Classification Search
CPC ................... H01L 23/48; H01L 23/488; H01L 23/49827; H01L 23/52; H01L 23/5386
See application file for complete search history.

(56) References Cited

U.S. PATENT DOCUMENTS

| | | | |
|---|---|---|---|
| 5,512,783 | A | 4/1996 | Wakefield et al. |
| 5,808,877 | A | 9/1998 | Jeong et al. |
| 6,252,305 | B1 | 6/2001 | Lin et al. |
| 6,353,265 | B1 | 3/2002 | Michii |

(Continued)

FOREIGN PATENT DOCUMENTS

| | | |
|---|---|---|
| JP | 58-184735 | 10/1983 |
| JP | 2002-231882 | 8/2002 |

(Continued)

OTHER PUBLICATIONS

Office Action dated Jun. 4, 2008 of Korean Application No. 10-2007-0060687.

*Primary Examiner* — Jae Lee
(74) *Attorney, Agent, or Firm* — Muir Patent Law, PLLC

(57) ABSTRACT

A multiple-chip-package (MCP) has multiple chip groups and multiple package terminal groups for electrical connections in the MCP. Semiconductor chips of the same chip group are electrically connected to the package terminals of the same package terminal group, while package terminals of different chip groups are electrically connected to the package terminals of different package terminal groups.

32 Claims, 28 Drawing Sheets

(51) Int. Cl.
*H01L 25/065* (2006.01)
*H01L 23/00* (2006.01)

(52) U.S. Cl.
CPC ............... *H01L 2225/06517* (2013.01); *H01L 2225/06527* (2013.01); *H01L 2225/06541* (2013.01); *H01L 2225/06562* (2013.01); *H01L 2924/00014* (2013.01); *H01L 2924/014* (2013.01); *H01L 2924/0105* (2013.01); *H01L 2924/01005* (2013.01); *H01L 2924/01006* (2013.01); *H01L 2924/01014* (2013.01); *H01L 2924/01028* (2013.01); *H01L 2924/01029* (2013.01); *H01L 2924/01033* (2013.01); *H01L 2924/01047* (2013.01); *H01L 2924/01058* (2013.01); *H01L 2924/01073* (2013.01); *H01L 2924/01076* (2013.01); *H01L 2924/01082* (2013.01); *H01L 2924/078* (2013.01); *H01L 2924/07802* (2013.01); *H01L 2924/15311* (2013.01); *H01L 2924/15331* (2013.01); *H01L 2924/181* (2013.01); *H01L 2924/19107* (2013.01)

(56) References Cited

U.S. PATENT DOCUMENTS

| | | | |
|---|---|---|---|
| 6,433,421 | B2 | 8/2002 | Masuda et al. |
| 6,438,015 | B2 | 8/2002 | Kyung |
| 6,900,528 | B2 | 5/2005 | Mess et al. |
| 7,592,691 | B2 | 9/2009 | Corisis et al. |
| 2002/0056911 | A1* | 5/2002 | Iwaya et al. .................. 257/738 |
| 2006/0267173 | A1 | 11/2006 | Takiar et al. |
| 2009/0096111 | A1* | 4/2009 | Fujiwara et al. ............. 257/777 |
| 2009/0218670 | A1* | 9/2009 | Yamamoto et al. .......... 257/686 |
| 2009/0219745 | A1* | 9/2009 | Matsui et al. ................. 365/51 |
| 2010/0117217 | A1 | 5/2010 | Park et al. |

FOREIGN PATENT DOCUMENTS

| | | |
|---|---|---|
| JP | 2005-150459 | 6/2005 |
| JP | 2008-091640 | 4/2008 |
| JP | 2009-099697 | 5/2009 |
| KR | 2002-0052593 | 7/2002 |
| KR | 10-2005-0022558 | 8/2003 |
| KR | 2005-0069392 | 8/2004 |
| KR | 2004-0049346 | 5/2005 |

* cited by examiner

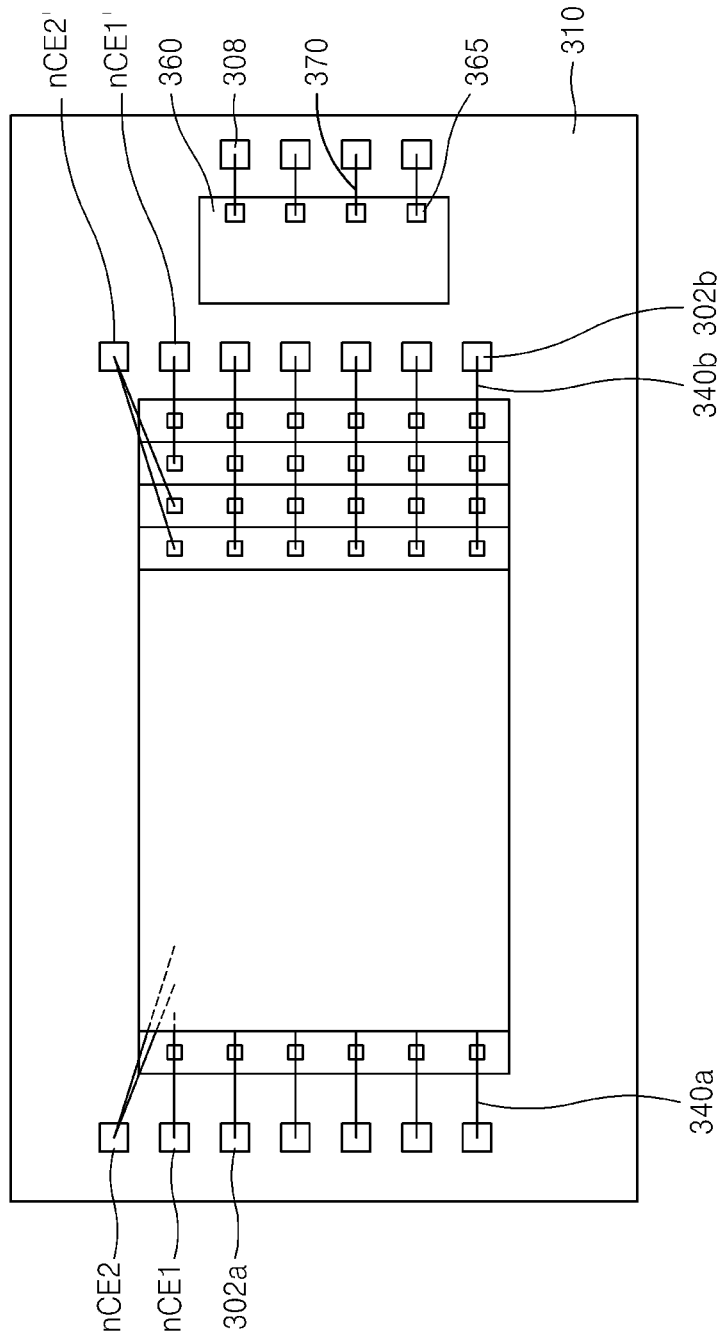

BALL-GRID-ARRAY PACKAGE, ELECTRONIC SYSTEM AND METHOD OF MANUFACTURE

CROSS REFERENCE TO RELATED APPLICATION

This patent application relates to subject matter of U.S. patent application Ser. No. 12/153,558, filed May 28, 2008 and U.S. patent application Ser. No. 12/630,363 filed Dec. 3, 2009, the entire contents of each hereby being incorporated herein by reference in their entirety. This patent application also claims priority from Korean Patent Application serial number 2009-0075343, filed on Aug. 14, 2009, the content of which is hereby incorporated by reference in its entirety for all purposes.

TECHNICAL FIELD OF THE DISCLOSURE

The technical field of this disclosure relates generally to the art of semiconductor devices; and more particularly to the art of electrical connections in modules having multiple semiconductor chips.

BACKGROUND OF THE DISCLOSURE

As electronic products move to smaller size, higher density and performance, semiconductors have correspondingly become smaller with their components and connections becoming denser. This in turn has lead to the development of multichip packages (MCPs) in which a plurality of semiconductor chips are stacked on a substrate such as a printed circuit board. This creates a high density, high performance package that is nonetheless small in size.

In current ball-grid-array (BGA) type of MCPs, the same functional chip terminals (i.e. chip I/Os) of the semiconductor chips in an MCP are often connected together. The commonly connected chip terminals are connected to the same external terminal, such as a package terminal. However, good chips may be wasted in an MCP when one chip of the MCP is defective; even though other chips may be otherwise operable, the entire MCP may be unusable due to the one defective chip.

Therefore, it is desired to provide new electrical connections in MCPs.

SUMMARY

In one example, a multichip package is disclosed, comprising: a substrate; a plurality of chips mounted to a first surface of the substrate, the plurality of chips comprising a first chip group of plural chips and a second chip group of plural chips; a ball grid array attached to a second surface of the substrate providing communication terminals of the package, the ball grid array comprising a first ball group and a second ball group; a first set of electrical connections to transmit at least one of signals and power, the first set of electrical connections connecting the first ball group to the first chip group; a second set of electrical connections to transmit at least one of signals and power, the second set of electrical connections connecting the second ball group to the second chip group, wherein at least one of the individual balls of the first ball group has an electrical connection of the first set of electrical connections to a signal terminal of one chip of the first chip group and to a signal terminal of a different chip of the first chip group; and wherein at least one of the individual balls of the second ball group has an electrical connection of the second set of electrical connections to a signal terminal of one chip of the second chip group and to a signal terminal of a different chip of the second chip group; and wherein the first ball group is dedicated to the first chip group and the second ball group is dedicated to the second chip group.

In another example, a multichip package is disclosed, comprising: a substrate; a controller; a plurality of chips mounted to a first surface of the substrate, the plurality of chips comprising a first chip group of plural chips and a second chip group of plural chips; a ball grid array attached to a second surface of the substrate providing communication terminals of the package; a first set of electrical connections to transmit signals, the first set of electrical connections connecting terminals of the first chip group to the controller; a second set of electrical connections to transmit signals, the second set of electrical connections connecting terminals of the second chip group to the controller; and a third set of electrical connections to transmit signals, the third set of electrical connections connecting the controller to the ball grid array, wherein at least one electrical connection of the first set of electrical connections is connected to a signal terminal of one chip of the first chip group and to a signal terminal of a different chip of the first chip group, and wherein at least one electrical connection of the second set of electrical connections is connected to a signal terminal of one chip of the second chip group and to a signal terminal of a different chip of the second chip group, and wherein the first set of electrical connections is dedicated to the first chip group and the second set of electrical connections is dedicated to the second chip group.

In yet another example, a system is disclosed, comprising: a printed circuit board; a controller mounted on the printed circuit board; a first multichip package mounted on the printed circuit board; and a second multichip package mounted on the printed circuit board, wherein each of the first and second multichip packages comprise: a substrate; a plurality of chips mounted to a first surface of the substrate, the plurality of chips comprising a first chip group of plural chips and a second chip group of plural chips; a ball grid array attached to a second surface of the substrate providing communication terminals of the package, the ball grid array comprising a first ball group and a second ball group, a first set of electrical connections to transmit at least one of signals and power, the first set of electrical connections connecting the first ball group to the first chip group, a second set of electrical connections to transmit at least one of signals and power, the second set of electrical connections connecting the second ball group to the second chip group, wherein at least one of the individual balls of the first ball group has an electrical connection of the first set of electrical connections to a signal terminal of one chip of the first chip group and to a signal terminal of a different chip of the first chip group, and wherein at least one of the individual balls of the second ball group has an electrical connection of the second set of electrical connections to a signal terminal of one chip of the second chip group and to a signal terminal of a different chip of the second chip group, and wherein the first ball group is dedicated to the first chip group and the second ball group is dedicated to the second chip group, and wherein the printed circuit board comprises a first electrical wiring to connect a ball of the first ball group of the first multichip package and a ball of the second ball group of the first multichip package to the controller.

BRIEF DESCRIPTION OF DRAWINGS

FIG. 1b is a cross-section of the embodiment of FIG. 1a;

FIG. 1c is a cross-section of a portion of a chip of embodiment of FIG. 1a.

FIG. 5b illustrates a top view of the MCP shown in FIG. 5a;

FIG. 14b illustrates a top view the MCP in FIG. 14a;

FIG. 14c illustrates an exemplary layout of the package terminals in the package substrate of the MCP in FIG. 14a;

FIG. 18b illustrates details of the packaging of the memory card of FIG. 18a;

DETAILED DESCRIPTION OF SELECTED EXAMPLES

Figure 1A:
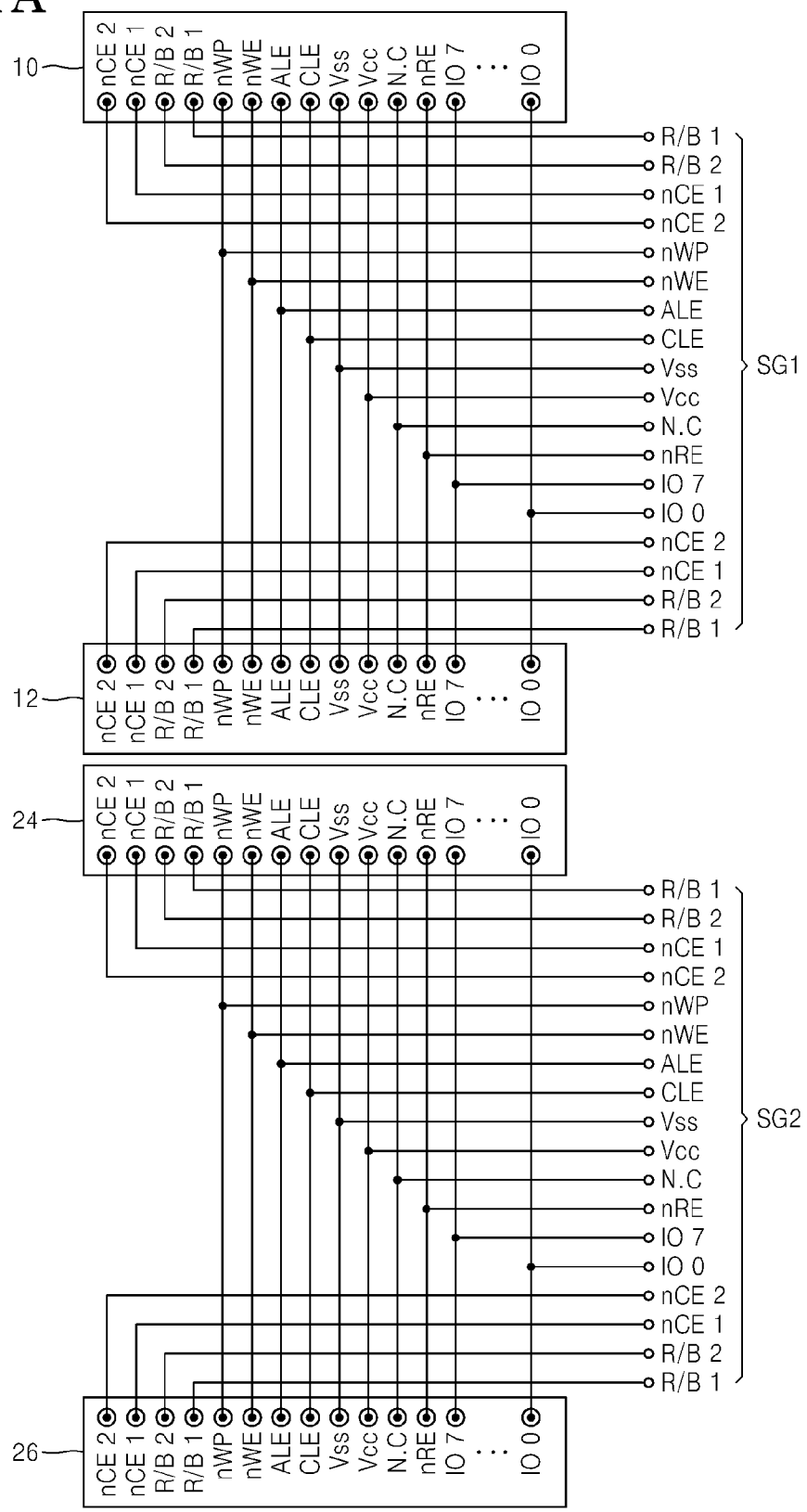
FIG. 1a is a schematic diagram of an embodiment of an MCP.

Example embodiments will now be described more fully with reference to the accompanying drawings, in which example embodiments are shown. The invention, however, may be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted In one embodiment, an MCP can have multiple package terminal groups that are employed for electrical connections in the MCP, wherein a package terminal group comprises one or more package terminals that can be solder balls, bumps, or the like.

In the MCP, semiconductor chips of the same chip group can be electrically connected to the package terminals of the same package terminal group, while package terminals of different chip groups are electrically connected to the package terminals of different package terminal groups. In one example, a package terminal group is dedicated for electrical connections of one chip group. For example, the package terminals of a package terminal group can be exclusively connected to the semiconductor chips of one chip group without being connected to semiconductor chips of the other chip groups. In one instance, in such an exclusive arrangement, the pads of a chip in a chip group would be connected only to package terminals in a package terminal group dedicated to that chip group, and not to other package terminals.

A package terminal group may comprise all package terminals transmitting desired signals (e.g., data, address and/or control signals) and power (e.g., Vdd, Vss, ground) between an exterior of the MCP package and the chip group to which the package terminal group is electrically connected. In one embodiment, different package terminal groups have no electrical connections with each other, such that one package terminal group is electrically isolated from other package terminal groups with respect to the electrical connections within the package. As such, the semiconductor chips of a chip group have substantially no electrical connections within the package with the package terminal groups other than the package terminal group that is dedicated to that chip group. For example, power may be supplied to one chip group via one package terminal group only, and may be supplied to another chip group via a different package terminal group only. In addition or in the alternative, signal connections providing information (e.g. one or more of data, control, command and/or address signals) may be supplied to one chip group via one package terminal group only, and may be supplied to another chip group via a different package terminal group only.

Semiconductor chips may be connected to the package terminals through package bonding pads. In one embodiment, some of the common functional chip terminals of the semiconductor chips in the same chip group are connected to the same package bonding pads, while common functional chip terminals of the semiconductor chips in different chip groups are connected to separate package bonding pads.

In one embodiment, each semiconductor chip comprises chip terminals for transmitting signals (e.g. data, control, command and/or address signals) and power. Typically, these chip terminals may be chip pads. In an example of connections of memory chips 10 and 12 as diagrammatically illustrated in FIG. 1a, data, address and command signals (or the like) are transmitted through chip terminals I/O 0 to I/O 7. Control signals and/or power are transmitted through chip terminals nRE (read enable), N.C. (not connected), Vcc (power), Vss (ground power), CLE (command latch enable), ALE (address latch enable), nWE (write enable), nWP (write protect), R/B 1 (read/busy out), R/B 2, nCE 1 (chip enable), and nCE 2. The N.C. terminals of the chips 10, 12, 24 and 26 are used during testing of the chips, but are not used during normal operation, and thus are not connected to package terminals within the package.

The chips of each chip group may be identical or substantially identical. For example, the chips may all be memory chips of the same design. The chips may be substantially identical, having pads with the same functions in the same layout (e.g., chip pads of the same function are located at the same relative location on their respective chip). Chip terminals (e.g., chip pads) corresponding in function are referred to as common functional chip terminals (or common functional chip pads).

FIG. 1a illustrates semiconductor memory chips 10, 12, 24 and 26 and a schematic of an example interconnection. Each of the memory chips 10, 12, 24 and 26 include chip terminals I/O 0 through I/O 7, nRE, N.C., Vcc, Vss, CLE, ALE, nWE, nWP. In this example, some of the chip terminals of chips 10 and 12 which have a common function are electrically connected in common to a respective corresponding package terminal; these same chip terminals of chips 24 and 26 which have a common function are electrically connected in common to a respective corresponding package terminal. Chip terminals nCE (chip enable) and R/B (read/write out) in each memory chip 10, 12, 24 and 26 are common functional chip terminals but have individual, separate connections to package terminals (i.e., each of these chip terminals has an individual electrical connection to a package terminal that is not shared with other chip terminals).

Figure 1B:
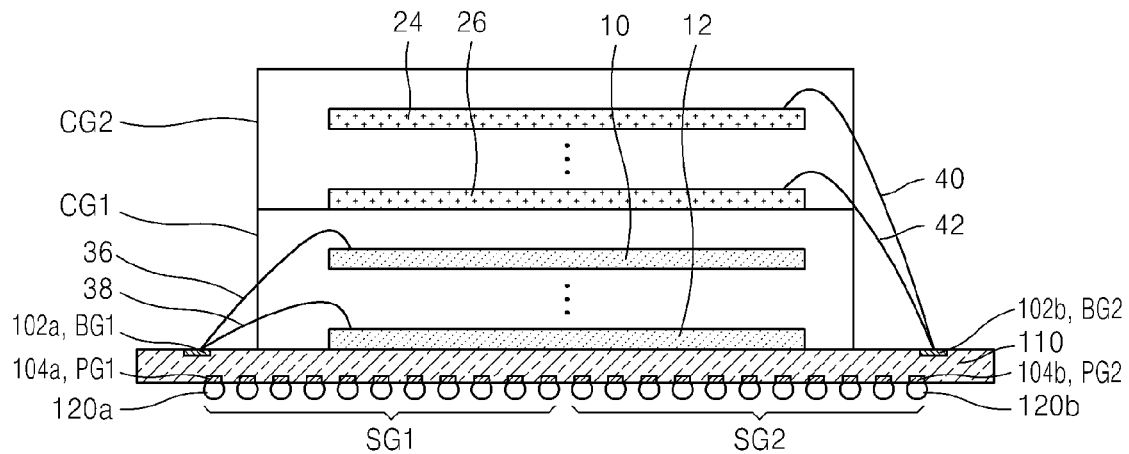

FIG. 1b illustrates a cross section of an MCP having the above electrical connection scheme. Referring to FIG. 1b, an MCP comprises chip groups CG2 and CG1. Chip group CG1 comprises semiconductor chips 10 and 12; and chip group CG2 comprises semiconductor chips 24 and 26. It is noted that an MCP can comprise any suitable or desired number of chip groups; and each chip group can comprise one or more semiconductor chips. As shown in FIG. 1b, the common functional chip terminals of the semiconductor chips 10 and 12 of the same chip group CG1 are electrically connected to the same package bonding pads of the same bonding pad group (e.g. bonding pad 102a of bonding pad group BG1). The common functional chip terminals of the semiconductor chips 24 and 26 of a different chip group CG2 are electrically connected to different bonding pads of different bonding pad groups (e.g. bonding pads 102b of bonding pad group BG2).

In the embodiment depicted in FIG. 1b, the semiconductor chips are vertically stacked on a major surface (e.g. the top surface) of package substrate 110. The package substrate (110) comprises bonding pad groups (e.g. bonding pad groups BG1 and BG2) with each bonding pad group having one or more bonding pads (e.g. pad 102a and other pads (not shown) of bonding pad group BG1 and pad 102b and other pads (not shown) of bonding pad group BG2). The bonding pads (e.g. pads 102a and 102b, etc.) can be formed, for example, on the major top surface of the package substrate (110) on which the semiconductor chips are stacked. The package substrate (110) further comprises package terminal groups SG1 and SG2, and each package terminal group comprises multiple package terminals. The package terminals can be formed in an array fashion, such as ball-grid-array (or bumps or the like) at the opposite major surface, such as the bottom major surface of the package substrate (110).

Figure 1C:
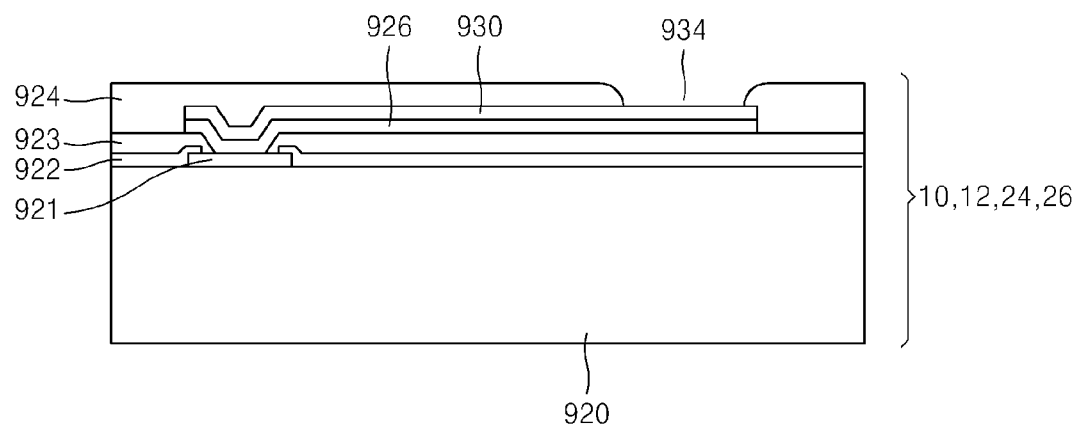
Figure 1D:
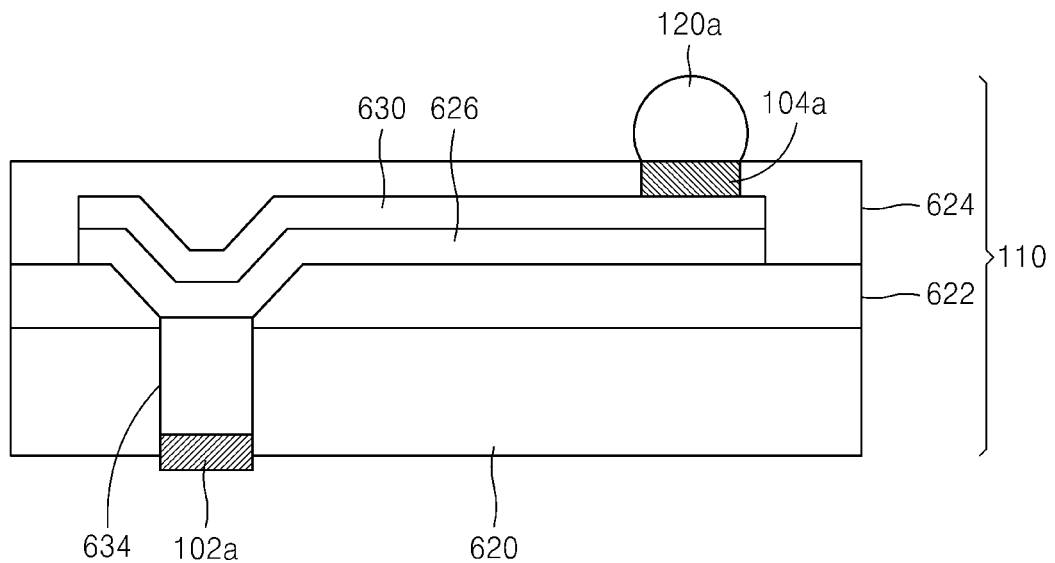
FIG. 1d is a cross-section of a portion of the package substrate of the MCP of FIG. 1b.

The bonding pads (e.g. pads 102a, 102b, etc.) are electrically connected to the corresponding package terminals, an example of which is shown in FIG. 1d. Referring to FIG. 1d, substrate 110 includes a core substrate 620, on which a wiring layer (here, comprising a pattern of two metal layers 626 and 630) is formed between two package ILD layers 622 and 624. The core substrate may be formed of FR4 or other suitable non-conductive material, such as that typically used for printed circuit boards. At a first location, the wiring 626/630 connects to a solder ball landing pad 104a (one pad of pad group PG1 of FIG. 1b, e.g.) to which solder ball/bump 120a is connected. At a second location, the substrate wiring 626/630 is connected to one end of a conductive via 634 formed through the core substrate 620. The other end of the conductive via 634 is connected to package bond pad 102a. Here, the bond pad 102a is formed directly on the conductive via 634. Alternatively, an additional wiring may be provided to connect the package bond pad 102a to conducive via 634, similar to that of 626/630, if preferred to achieve a desired wiring pattern and pad/solder ball locations.

Referring to FIG. 1c, at least one of the semiconductor chips 10, 12, 24 and 26 can include a redistribution layer 928 connected to an initial chip pad 921 to move an electrical connection position between the semiconductor chip and the package substrate 110. The initial chip pad 921 is connected to an internal circuit (not shown) formed in a semiconductor substrate 920 and disposed on the semiconductor substrate 920. Passivation layer 922 can be formed on the semiconductor substrate 920 and cover a portion of the initial chip pad 921 so that the other portion of the initial chip pad 921 is exposed through an opening. The passivation layer can be comprised of silicon nitride, silicon oxide or silicon oxynitride. First ILD (interlayer dielectric) 923 can be formed on the passivation layer 922 to decrease a mechanical stress caused by wire bonding process. The first ILD 923 can be comprised of a first polymer. The redistribution layer 928 comprising a metal wiring layer 930 and a seed metal layer 926. The seed metal layer 926 can be comprised of Ti, Cu, Ta, TiN, TaN or other suitable conductive materials (e.g. metallic elements, metal alloys, or other materials) and can be a barrier layer to prevent a metal ion diffusion into a semiconductor substrate 920 during the metal wiring layer formation. The metal wiring layer 930 may be comprised of Cu and Ni or other desired conductive materials, such as metallic elements, metal alloys, or other materials. Second ILD (interlayer dielectric) 924 can be formed on the redistribution layer 928 and a portion of the first ILD 923 layer. The second ILD 924 has an opening so that an exposed portion of the redistribution layer 928 can be defined as a redistributed chip pad 934. The second ILD 924 can be comprised of a second polymer. Dielectric constant of the first polymer can be lower than dielectric constant of the second polymer to decrease a parasitic capacitance enforced to the semiconductor substrate 920.

Referring again to FIG. 1b, wires 36, 38, 40, and 42 connect the semiconductor chips 10, 12, 24, and 26 to the bonding pads 102a and 102b for transmitting power/ground and/or signals to and from the connected semiconductor chips. One end of one of the wires 36, 38, 40 and 42 can be connected to the redistributed chip pad 934 or the initial chip pad 921 when the semiconductor chips have no redistribution layer 928. Wires 36 and 38 electrically connect a common functional chip pad of semiconductor chips 10 and 12 to solder ball 120a of ball group SG1. Wires 40 and 42 electrically connect a common functional chip pad of semiconductor chips 24 and 26 to solder ball 120b of ball group SG2.

A bonding pad is electrically connected to a set of common functional chip terminals of the semiconductor chips in the same chip group. For example, a bonding pad 102*a* of the bonding pad group BG1 is electrically connected to common functional chip terminals (e.g. the IO 7 pads of semiconductor chips 12 and 10). Bonding pad 102*b* from the bonding pad group BG2 is electrically connected to a set of common functional chip terminals (e.g. the IO 7 pads of semiconductor chips 24 and 26). However, while bonding pads 102*a* and 102*b* are connected to common functional chip terminals of different chip groups, respectively, without further connections outside the MCP, they are different electrical nodes (they do not share an electrical connection within the package).

In this example, the bonding pads electrically connected to the semiconductor chips of the same chip group are electrically connected to the package terminals of the same package terminal group; bonding pads electrically connected to the semiconductor chips of different chip groups are electrically not connected to the package terminals of the same package terminal group, but to different package terminal groups. For example, the package bonding pad 102*a* is electrically connected to chip group CG1 and to package terminal group SG1, while bonding pad 102*b* is electrically connected to chip group CG2 and package terminal group SG2. With such configuration, semiconductor chips of different chip groups (e.g. CG2 and CG1) are electrically connected to different package terminal groups (e.g. SG2 and SG1). Semiconductor chips of the same chip group are electrically connected to the package terminals of the same package terminal group (e.g. chips 10 and 12 of chip group CG1 are connected to SG1).

Each one of the package terminal groups (e.g. SG1 and SG2) may comprise all package terminals transmitting desired signals (e.g., data, address, command and/or control signals) between an exterior of the MCP package and the chip group to which the package terminal group is connected electrically. In one embodiment, package terminal group SG2 has substantially no electrical connections with package terminal group SG1 provided within the package. Each package terminal group may be electrically isolated from the other package terminal group with respect electrical connections provided within the package. With the above electrical connection configuration, chip groups CG2 and CG1 have substantially no electrical connections therebetween provided within the package. However, as discussed further below, chip groups CG2 and CG1 may have common functional terminals electrically connected by connecting package terminals with conductors located outside the package.

The embodiment of FIG. 1*a*-1*d* provides an MCP where chips in the package share connections to package terminals and reduces the number of package terminals needed. However, the MCP also provides separate connections for separate chip groups. As such, if a defect occurs during manufacturing (e.g., within one of the chips, or during packaging) with respect to a chip, the MCP may still function and not be considered completely defective.

For example, if bonding wires 36 and 38 were to touch due to a defective molding process (to encapsulate the MCP), chip group CG1 may not be operable. However, because the electrical connections to chip group CG2 are separate from those of CG1, the MCP can still be used for communications with chips of chip group CG2. Chips of CG1 may be disconnected from a system circuit board on which the MCP is mounted (either by failing to connect terminal group SG1 to circuit board wiring during mounting of the MCP to the system circuit board, or by later disconnecting circuit board wiring from terminal group SG1). Alternatively, chips of CG1 may remain connected to a system circuit board via terminal group SG1, but a system controller may be programmed to consider chips of CG1 defective (and thereby avoid operations with chips of CG1).

Figure 2:
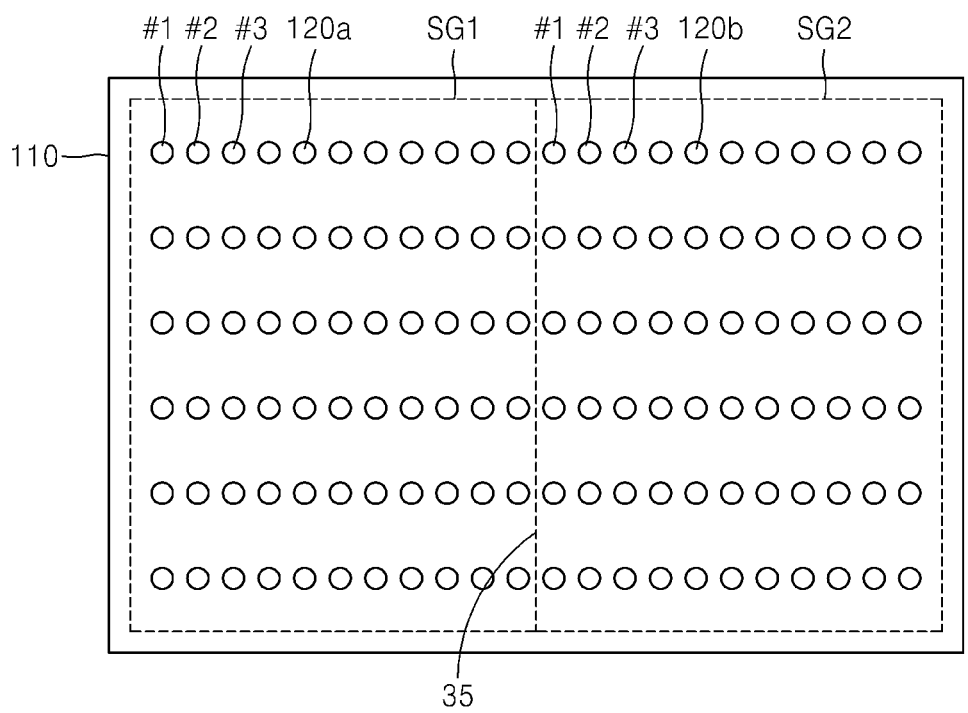
FIG. 2 is an exemplary layout of the package terminals on the package substrate of the MCP in FIG. 1b.
Figure 3:
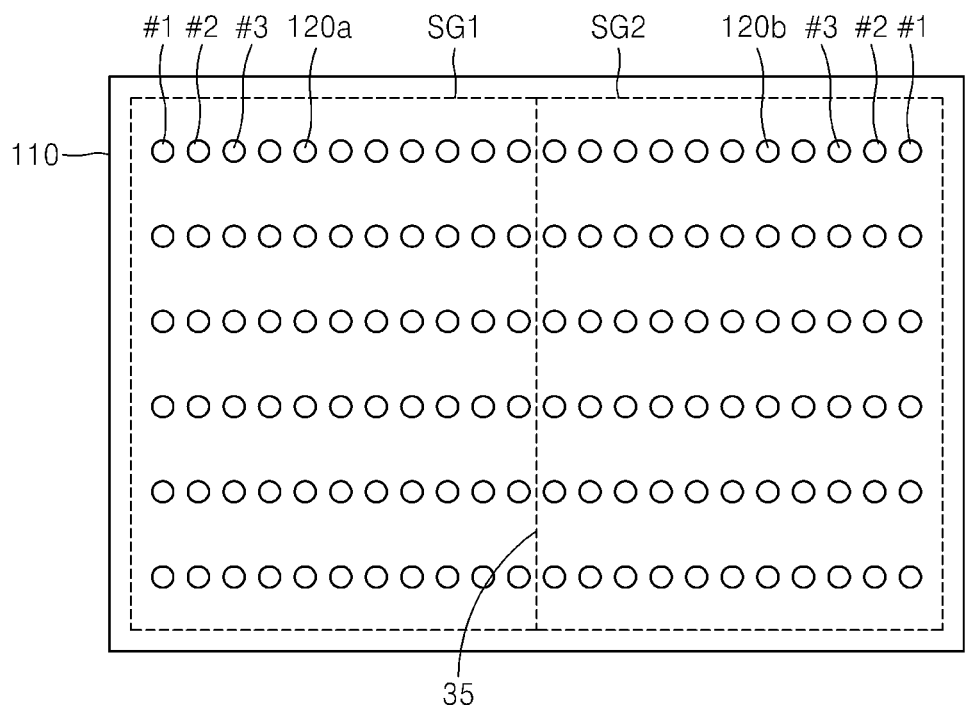
FIG. 3 is another exemplary layout of the package terminals on the package substrate of the MCP in FIG. 1b.
Figure 4:
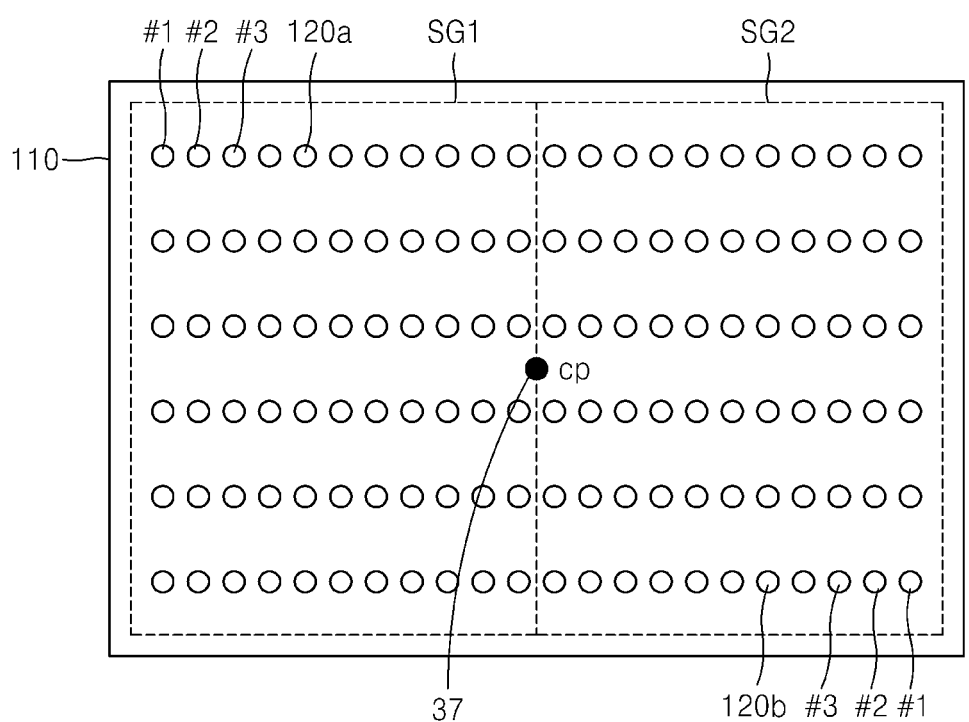
FIG. 4 is yet another exemplary layout of the package terminals on the package substrate of the MCP in FIG. 1b.

FIGS. 2-4 show different exemplary package terminal layouts on substrate 110, wherein two package terminal groups SG1 and SG2 are illustrated. It will be appreciated by those skilled in the art that a package substrate (and an MCP) may have any desired number of package terminal groups. The package terminals of different package terminal groups may be deployed at different physical locations on the package substrate 110. In this example, package terminals of each package terminal group are grouped together, such that, except for the boundaries between different package terminal groups, adjacent or neighboring package terminals are of the same package terminal group. In general, package terminal groups can be disposed and arranged on the package substrate at any desired locations and in any desired orders. The package terminal groups can also be arranged symmetrically on the package substrate.

In one example as diagrammatically illustrated in FIG. 2, the package terminal groups can be arranged with a translational symmetry. Referring to FIG. 2, each circle represents a package terminal (e.g. a ball, a bump, or the like). As depicted in FIG. 2, the package terminal groups SG1 and SG2 are juxtaposed along the length (or the width) of the package substrate 110. Dashed line 35 shows the boundary of package terminal groups SG1 and SG2. The package terminal groups SG1 and SG2 have the same layout with respect to common functional terminals (terminals connected to a corresponding common functional chip pad of each chip in the respective chip group) and are located adjacent to each other.

The package terminal groups SG1 and SG2 have a translational symmetry along the length (or the width) of the package substrate (110). In one embodiment, the translational symmetry distance is substantially equal to or larger than the length (or the width) of a package terminal group (e.g. SG2). Alternatively, the translational symmetry distance can include any suitable value as long as package terminal groups SG1 and SG2 do not overlap. Each package terminal connected to common functional chip terminals of semiconductor chips of a first chip group is at a translational symmetrical position as compared to a corresponding package terminal connected to the same type of common functional chip terminals of semiconductor chips of a second chip group. For example, #1 package terminal of package terminal group SG1 may be electrically connected to the chip terminals I/O7 pads of the semiconductor chips 10 and 12 of chip group CG1 (see FIG. 1*b*). #2 package terminal of package terminal group SG1 may be electrically connected to the chip terminals I/O6 pads of the semiconductor chips 10 and 12 of chip group CG1. #3 package terminal of package terminal group SG1 may be electrically connected to power terminals (e.g., Vcc) of the semiconductor chips (e.g. 10 and 12) of chip group CG1. In package terminal group SG2, #1 package terminal is electrically connected to the chip terminals I/O7 pads of the semiconductor chips 24 and 26 of chip group CG2. #2 package terminal is electrically connected to the chip terminals I/O6 pads of the semiconductor chips 24 and 26 of chip group CG2. #3 package terminal is electrically connected to the power terminals (Vcc) of the semiconductor chips 24 and 26 of chip group CG2. As a result, the #1, #2 and #3 package terminals of different package terminal groups SG1 and SG2 are at translational symmetric positions with respect to each other.

The package terminal groups (e.g. SG1 and SG2) can alternatively be arranged at locations with line symmetry, an example of which is shown in FIG. 3. Referring to FIG. 3, package terminal groups SG1 and SG2 are juxtaposed on package substrate 110 with respect to line 35. The package terminal groups SG1 and SG2 are disposed at locations that are symmetric along line 35. It is noted that the package terminal groups can be positioned with line symmetry along a line disposed at any suitable locations within the package substrate and along any desired directions, such as along a diagonal of the package substrate 110.

As yet another example, the package terminal groups can be arranged at locations that are symmetric around a point, an example of which is shown in FIG. 4. Referring to FIG. 4, "cp" is the geometric central point of package substrate 110. The package terminal groups SG1 and SG2 are arranged such that the corresponding package terminals (e.g. #1, #2, and #3) connected to a set of common functional chip terminals of semiconductor chips at a first chip group are at locations symmetric around the "cp" point compared to a set of the same types of common functional chip terminals (e.g., #1, #2, #3) of semiconductor chips of a second chip group. In other examples, the symmetric point can be at any other suitable locations in the package substrate 110.

The package terminal groups on the package substrate 110 can be arranged to have other suitable symmetries, such as combinations of the symmetries discussed above. In fact, the package terminals in a package terminal group may or may not be arranged to a regular array. For example, the package terminals in a package terminal group may be arranged into an array but with variable pitches (or array constants). Even formed into an array, the array may not be rectangular. Instead, the array may have any suitable geometric shapes, such as non-rectangular polygons, circular, or others. In addition, the arrays may be depopulated locations where the regularity of the array is interrupted and one or more terminal locations are skipped. Further, the array may include dummy solder balls, which may be solder balls connected to the bottom surface of the package substrate but have no signal and power connections to any of the chips of the package.

Regardless of whether the semiconductor chips of the MCP are the same or different, the geometric shapes and positions of the package terminal groups on the package substrate can be designed independently from the semiconductor chips.

It is noted that the above discussions are for demonstration purpose, and should not be interpreted as limiting the scope of the disclosed embodiments. Other variances are also applicable. In one example, FIG. 1b shows that the sets of bonding pads (e.g. BG1 and BG2) and the semiconductor chips (e.g. 10, 12, 24, and 26) are positioned on a substantially flat surface, which is the top major surface, of package substrate 110. In particular, the sets of bonding pads are on substantially the same plane (e.g. the major top surface of package substrate 110). In other examples, the semiconductor chips and the package bonding pads can be disposed on different planes. For example, the semiconductor chips can be stacked on a bottom surface of a trench formed in package substrate 110, or can be stacked on an elevated surface above the surface on which at least one of the package bonding pads is positioned. The bonding pads can alternatively be disposed at different planes.

As shown in FIG. 1b, in one embodiment, the bonding pads electrically connected to different chip groups are located at different sides of package substrate 110. For example, the bonding pads of bonding pad set BG1 that are electrically connected to pads of chip group CG1 can be deployed along a width side of package substrate 110, while the package bonding pads of bonding pad set BG2 that are connected to chip group CG2 can be deployed along a different side of package substrate 110, such as along the opposite width side, or alternatively along the length of package substrate 110.

Figure 5A:
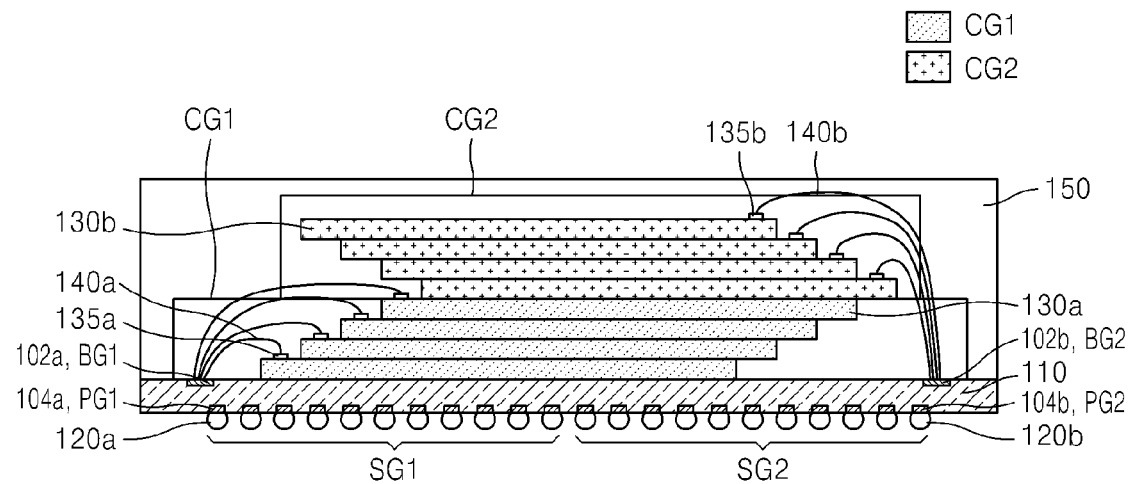
FIG. 5a is a cross-section of an exemplary MCP.

The arrangement of chips and the connection of common functional chip pads to a corresponding package terminal in an MCP can be implemented in various configurations, and variations thereof, are discussed in connection with the examples discussed below. FIG. 5a illustrates one exemplary MCP comprising chip groups CG2 and CG1. For simplicity and demonstration purposes, each one of the chip groups CG2 and CG1 is depicted as comprising four semiconductor chips. However, a chip group may include additional or fewer chips. Chip groups of eight chips may be preferred. Each semiconductor chip has chip pads, such as chip pad 135b of the top-most semiconductor chip of chip group CG2 and 135a of the bottom-most semiconductor chip of chip group CG1, for transmitting signals (data, address and/or control signals) to and from the semiconductor chips. In the example as shown in FIG. 5a, the chip pads are at the upper surfaces of the semiconductor chips (e.g. opposite to the bottom surfaces of the chips that face the package substrate 110) and can be the shape of the initial chip pad 921 or the redistributed chip pad 934.

The semiconductor chips are stacked on the package substrate 110 such that the semiconductor chip is shifted a distance relative to the semiconductor chip immediately below. In this example, the shifted distance is sufficient to expose the chip pads of the lower semiconductor chip (which may be formed in a row adjacent an edge of the semiconductor chip). The semiconductor chips in a chip group are stacked in a stair-step fashion. The stair-steps of different chip groups can be along the same or different directions.

For example, the semiconductor chips of chip group CG1 may be positioned in a stair-step fashion that rises along an upper-right direction. The semiconductor chips of chip group CG2 may be positioned on the chip group CG1, and in a stair-step fashion that rises along an upper-left direction, a direction having reverse horizontal component of the stacking direction as compared to that of the stair-steps of the lower chip group CG1.

The above exemplary stair-step positioning exposes the chip pads of a chip with respect to the chips stacked above. The chip pads (e.g. 135a and 135b) are electrically connected to bonding pads (e.g. 102a of bonding pad group BG1 and 102b of bonding pad group BG2) through wire bonds (e.g. 140a and 140b). Bonding pad 102a, for example, is electrically connected to a common functional chip pad for each of the semiconductor chips of the chip group CG1. As such, each of the chip pads to which bonding pad 102a is connected has the same function. For example, the chip pads to which bonding pad 102a is connected may all correspond to the I/O7 chip pad of each of the chips. Other bonding pads of bonding group BG1 may similarly connect to pads having the same functionality of each of the chips of the chip group CG1. Similar to pad 102a, bonding pad 102b is connected to a common functional chip pad for each of the semiconductor chips of chip group CG2. Each of the chip pads to which bonding pad 102b is connected has the same function with respect to its chip.

The bonding pads (e.g. 102a and 102b) may be electrically connected to the ball-grid-arrays (e.g. SG1 and SG2) in the same way as discussed above with reference to FIGS. 1b and 1*d*, which will not be repeated herein. As such, the semiconductor chips stacked above the package substrate 110 are electrically connected to the package terminals (balls, bumps, or the like) in the corresponding package terminal groups (e.g. SG1 and SG2).

In this embodiment, the semiconductor chips (including their chip pads), the wire bonds and the remaining upper surface of package substrate 110 (including package bond pads BG1 and BG2) is sealed in an encapsulant, such as resin material 150. Encapsulants other than resin 150 may be employed, such as epoxy, EMC, or any other suitable materials.

Figure 5B:
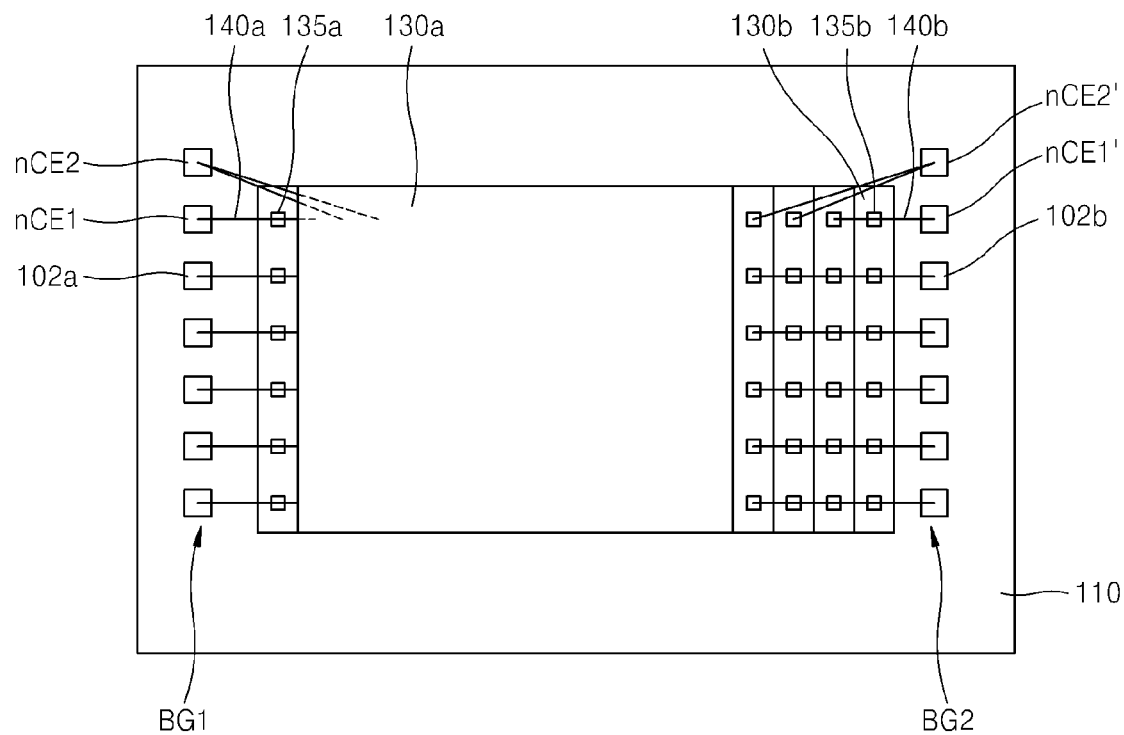

FIG. 5*b* shows a top view of the MCP in FIG. 5*a*. Chips 130*a* and 130*b* are the bottom-most semiconductor chip of chip group CG1 and the bottom-most semiconductor chip of chip group CG2, respectively. Due to the stair-step positioning, the semiconductor chips 130*a* and 130*b* are shifted a distance relative to each other along the length or the width of the MCP package. Chip pads, such as 135*a* and 135*b* are exposed with respect to the chip stack. Wire bonds, such as 140*a* and 140*b*, electrically connect the chip pads (e.g. 135*a* and 135*b*) and the package bonding pads (e.g. 102*a* and 102*b*). The package bonding pads are electrically connected to the corresponding package terminals (e.g. balls, bumps, or the like) of the ball-grid-array that is formed on the bottom surface of the package substrate 110.

The chips of the chip groups CG1 and CG2 can be selected by chip enabling signals nCE1, nCE2, nCE1', and nCE2'. Here the chip enable signals are denoted nCE to indicate enabling with a logic low signal, but the use of the phrase chip enable in this disclosure contemplates enabling with any type of chip enable signal (e.g., both logic low and logic high CE are both considered chip enable signals).

In this example, each chip group is connected to two chip enable chip terminals. For example, two chips of chip group CG1 are connected to nCE1 and the other two chips of chip group CG1 are connected to nCE2. Similarly, the chips of another chip group (e.g. CG2) are connected to nCE1' and nCE2'. The CE terminals are individually connected to separate bonding pads. Thus, each chip enable signal enables two chips simultaneously in this example. The access of chips connected to the same chip enable signal may be distinguished based on address signals.

Figure 26:
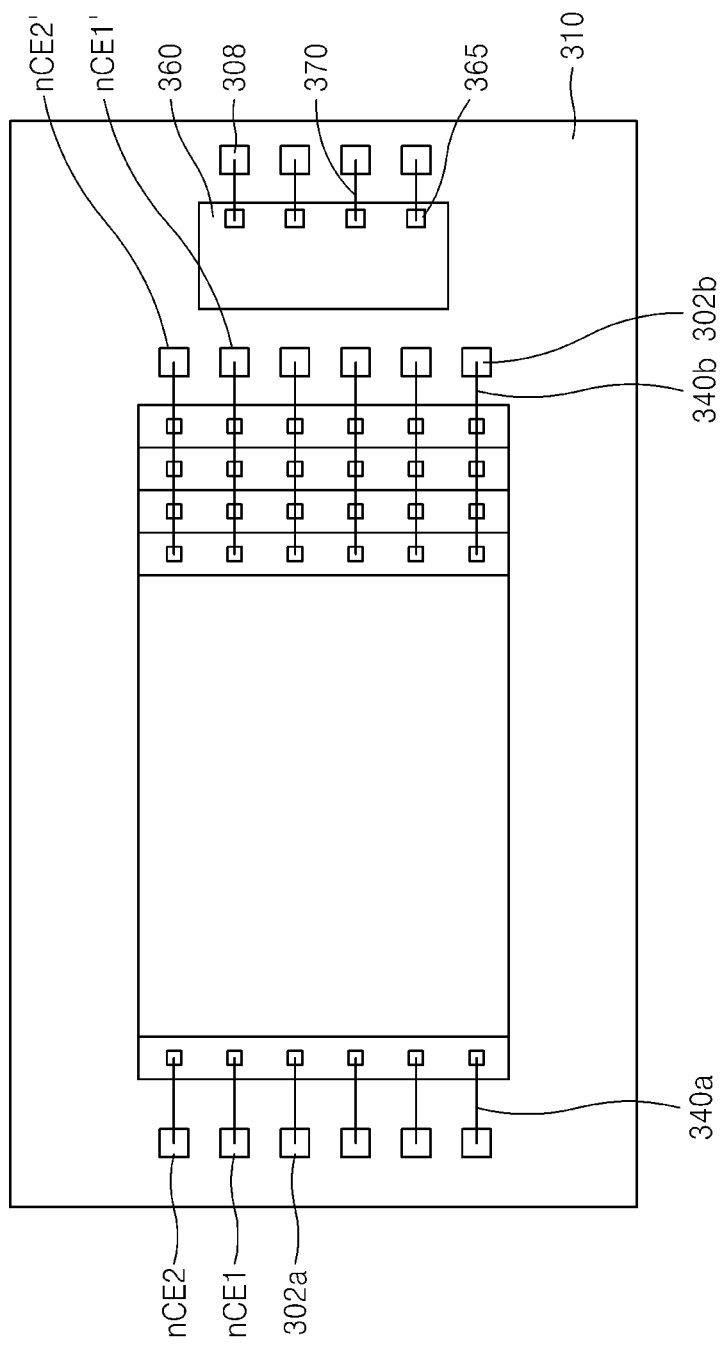
FIGS. 26, 27a, 27b and 28 alternatives for chip enablement connections to chips of the MCP embodiments.

In an alternative example, each chip may have its own dedicated chip enable connection (e.g., there would be eight chip enable signals for the embodiment of FIG. 5*b*, one for each chip). In yet another alternative example, chip enable signals may be shared with all chips of one chip group, as illustrated in FIG. 26 and described further below.

Figure 5C:
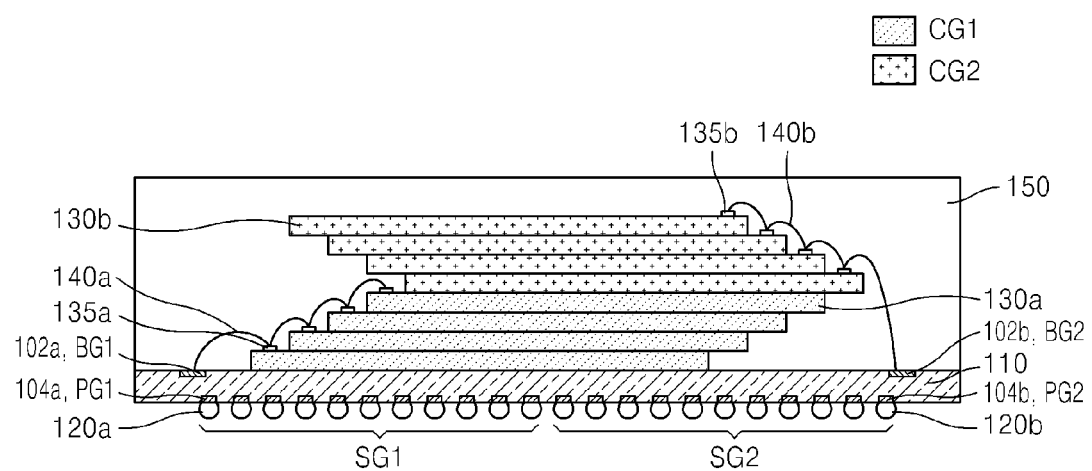
FIG. 5c is a cross-section of another exemplary MCP.

Other than electrically connecting each of the chip pads directly to the corresponding bonding pads in parallel as shown in FIG. 5*a*, the chips pads can be sequentially connected to the corresponding bonding pads of neighboring chips in the stack of chips of a chip group, an example of which is illustrated in FIG. 5*c*.

Referring to FIG. 5*c*, the bonding wires electrically connect the corresponding common functional chip pads of adjacent chips of the same chip group. One of these chip pads (here, the chip pad of the bottommost chip of the chip group) is also connected via a bonding wire to the designated bonding pads (e.g. 102*a*, 102*b*) to connect all of the common functional chip pads of a chip group to a package bonding pad and a corresponding package terminal (through redistribution wiring in substrate 110—not shown in FIG. 5*c*).

Figure 6:
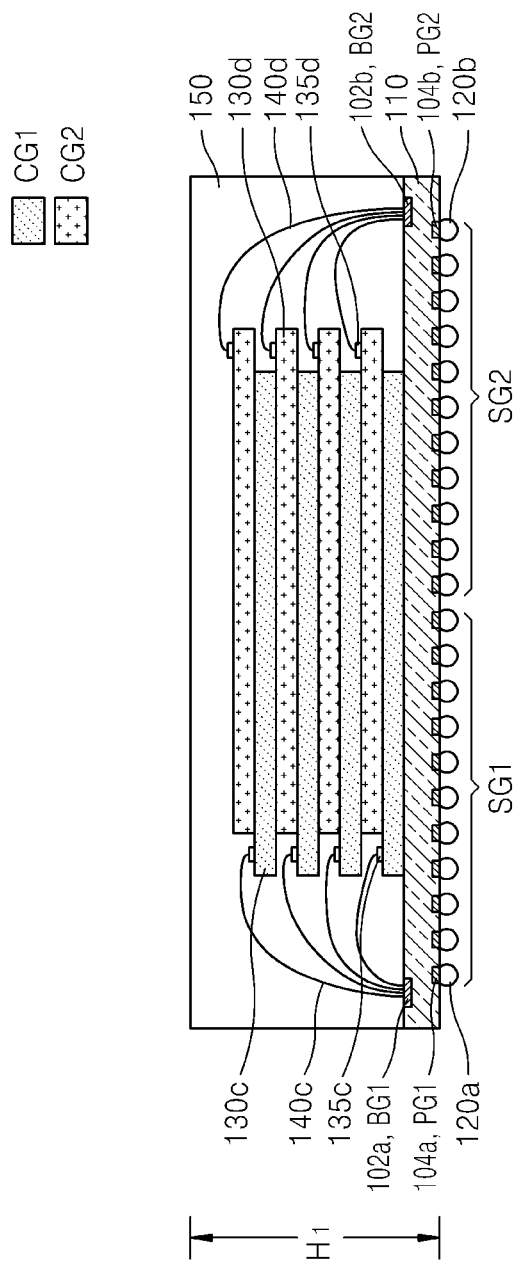
FIG. 6 is a cross-section of yet another exemplary MCP.

FIG. 6 illustrates a cross-section of yet another exemplary MCP in which embodiments of this disclosure is implemented. Referring to FIG. 6, chips of chip groups CG1 and CG2 are alternately stacked on package substrate 110. The adjacent chips are shifted a distance so as to expose the chip pads (e.g. chip pads 135*c*, 135*d*) with respect to the above neighboring chip. The exposed chip pads are electrically connected to the corresponding bonding pads (e.g. bonding pad 102*a* of bonding pad group BG1; bonding pad 102*b* of bonding pad group BG2), in the same way as discussed above with reference to FIG. 1*b*, which will not be repeated herein.

In the example as illustrated in FIG. 6, the chips of the same chip group can be vertically aligned (e.g. the geometric centers of the chips are aligned along a line perpendicular to the surface of the package substrate 110). The chips of the different chip groups, however, are shifted relative to the chip of the other chip group so as to expose the chip pads. In this example, chips can be directly stacked on top of another, e.g. the bottom surface of a chip coincides with the top surface of the chip immediate below. In some examples, other materials, such as adhesive materials can be disposed between the bottom surfaces and the top surfaces of adjacent chips.

Figure 7:
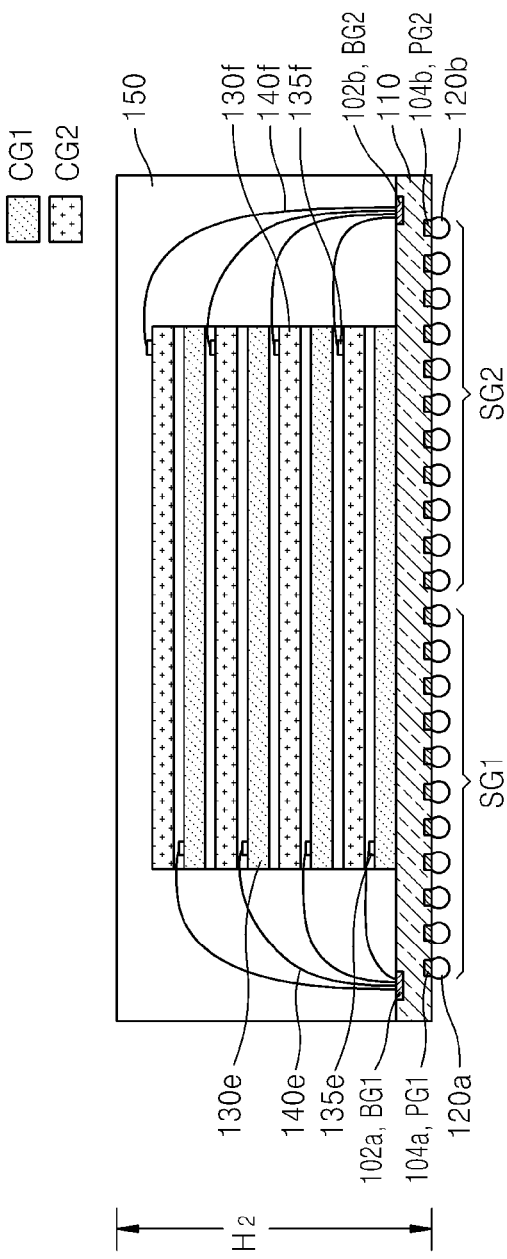
FIG. 7 is a cross-section of yet another exemplary MCP.

Referring to FIG. 7, the exemplary MCP in FIG. 7 is the same as that in FIG. 6 except that the chips of a chip group (CG1 or CG2) in FIG. 7 are stacked on package substrate 110 without shift. In order to expose the chip pads (e.g. 135*e*, 135*f*), adhesive materials and/or underfill materials are disposed between adjacent chips. The adhesive material and/or underfill material between two adjacent chips may have a thickness to ensure sufficient space for wire bonding (e.g. wires 140*e* and 140*f*). As a consequence, the height $H_2$ is larger than the height $H_1$ of the MCP in FIG. 6.

Figure 8:
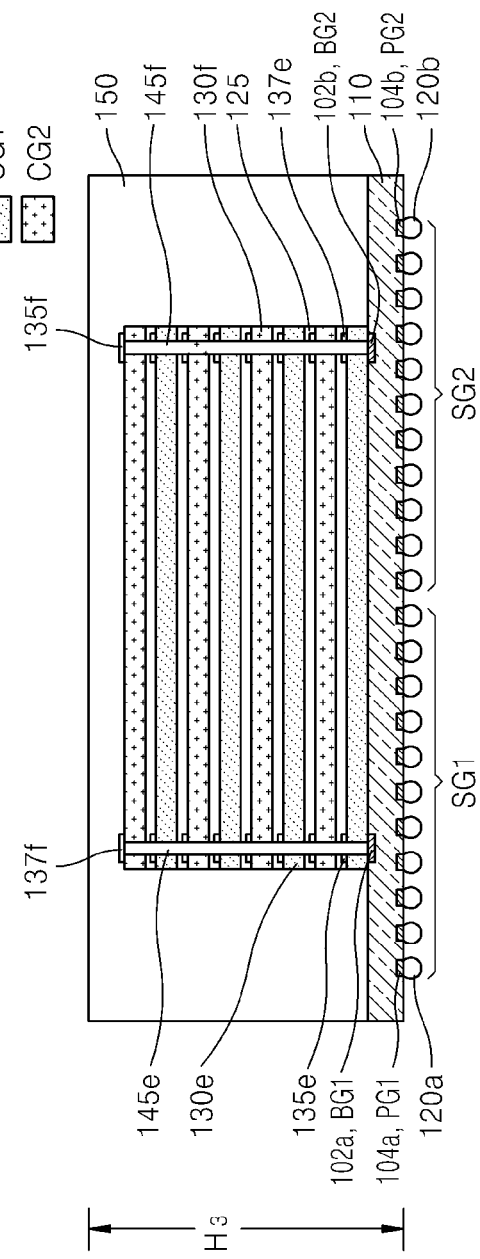
FIG. 8 is a cross-section of yet another exemplary MCP.

The wires and wire bonding in FIG. 7 can be replaced by other type of electrical connections, one of which is use of TSV's (through-substrate via, such as a through-silicon-via) as illustrated in FIG. 8. A TSV is a via through a substrate; and the via is filled with a material, such as an electrically conductive material. The via may be a through-hole in the substrate only or may penetrate the entire chip (or die area in a wafer, e.g., prior to singulation of the die into a chip). The substrate can be a silicon substrate or other substrate, such as germanium or glass or other substrates.

Referring to FIG. 8, conductors 145*e* and 145*f* extend vertically from the substrate through each of the chips. Each of the conductors 145*e* and 145*f* are formed of TSV's of each of the chips through which they extend. The TSV in each chip is positioned to electrically connect to a chip pad (e.g. 135*e*, 135*f*) of the chips, which may be an active chip pad or a dummy chip pad. In the example of FIG. 8, vertical conductor 145*e* connects common functional chip pads for chip group CG2 while 145*f* connects common functional chip pads for chip group CG2.

As shown, vertical conductor 145*e* is connected to common functional chip pad 135*e*, and corresponding common functional chip pads of other chips of chip group CG1. Vertical conductor 145*e* is also connected to dummy chip pads of chips of chip group CG1, such as dummy chip pad 137*f*. In general, a dummy chip pad of a chip does not connect a signal (e.g. data, address, control signals) power or ground used for operating that chip (e.g., signals, power or ground for operating internal logic circuitry (input buffer, memory, etc.)). For example, a dummy chip pad may not electrically connect to anything but a TSV (though not absolutely required). As another example, a dummy chip pad may connect to electrostatic discharge circuit.

A dummy chip pad may be used as shown in FIG. 7 to assist in assembling the vertical conductor 145*e*. For example, vertical conductor 145*e* may be formed by forming active chip pads and dummy chip pads in wafers, forming TSVs in die areas in multiple wafers (corresponding to chips not yet singulated from the wafer) through active pads and dummy chip pads, stacking the wafers to align TSV's of an upper wafer to land/contact with pad of the lower neighboring wafer, heating the stack of wafers to bond the stack of TSVs and chip pads to create the vertical conductor 145e. As can be appreciated, the relatively large amount of metal used for a chip pad assists in both horizontal (X-Y) alignment and vertical (Z) alignment when stacking the wafers, both for active chip pads and dummy chip pads.

Vertical conductor 145f is similar to vertical conductor 145e, except that it connects active chip pads of chip group CG2 and extends through dummy chip pads of chip group CG1 (such as 137e).

The TSVs and/or the chip pads of the chips are sequentially connected, e.g. from the top chip to the bottom chip. The vertical conductors 145e and 145f are then electrically connected to the corresponding bonding pads 102a and 102b on the package substrate 110. In this way, the electrical connections achieved by using bonding wires as those in FIG. 1b, FIG. 6, and FIG. 7 are accomplished using TSVs and chip pads.

By using TSVs rather than bond wires, the spaces between adjacent chips can be reduced, as compared to those of FIG. 7. The height $H_3$ of the MCP in FIG. 8 can thus be smaller than the height $H_2$ of the MCP in FIG. 7. The MCP of FIG. 8 may have a smaller lateral size than that in FIG. 6 due to absence of shift distance (i.e., the edges of the chips may be vertically aligned).

It is noted that the electrical connection scheme using TSVs shown in FIG. 8 is applicable to other MCPs. The TSVs of the chips can be vertically aligned along the normal direction of the package substrate 110. In other examples, not all TSVs are vertically aligned, and/or not all the TSV's of different sets of chips may be vertically aligned.

In an alternative example, one or more vertical conductors may connect common functional chip pads of chips of multiple (both) chip groups (for example, all chips of two chip groups or all similar chips in the MCP) for a particular function, and may be connected to a single package terminal 120 of the MCP. Other vertical conductors may keep the connection relationships described above (dedicated to transmit power, ground or signals for a particular chip group only). The vertical conductor(s) shared between multiple chip groups may transmit power or ground and signals may transmitted via vertical conductors dedicated to a chip group. Alternatively, the vertical conductor(s) shared between multiple chip groups may transmit signals while power and ground may transmitted via vertical conductors dedicated to a chip group (having the connection relationships described above). These hybrid arrangements may be beneficial to address signal, power or ground noise issues by providing separate connections when such noise becomes an operating issue. The vertical conductor shared between chips of multiple chip groups can be positioned around or near the geometric center of the chips.

It will be appreciated by those skilled in the art that FIG. 6, FIG. 7, and FIG. 8 are only selected examples for demonstration. An MCP with the electrical connection schemes and chip disposition schemes as shown in the above features may have any desired number of chip groups; and each chip group may have any number of chips. The chips of different chip groups (e.g. CG1 and CG2) can be disposed on the package substrate 110 in a number of ways. For example, the chips can be interleaved on the package substrate. Any desired number of chips of a different chip group can be positioned between two adjacent chips of one chip group.

Figure 9:
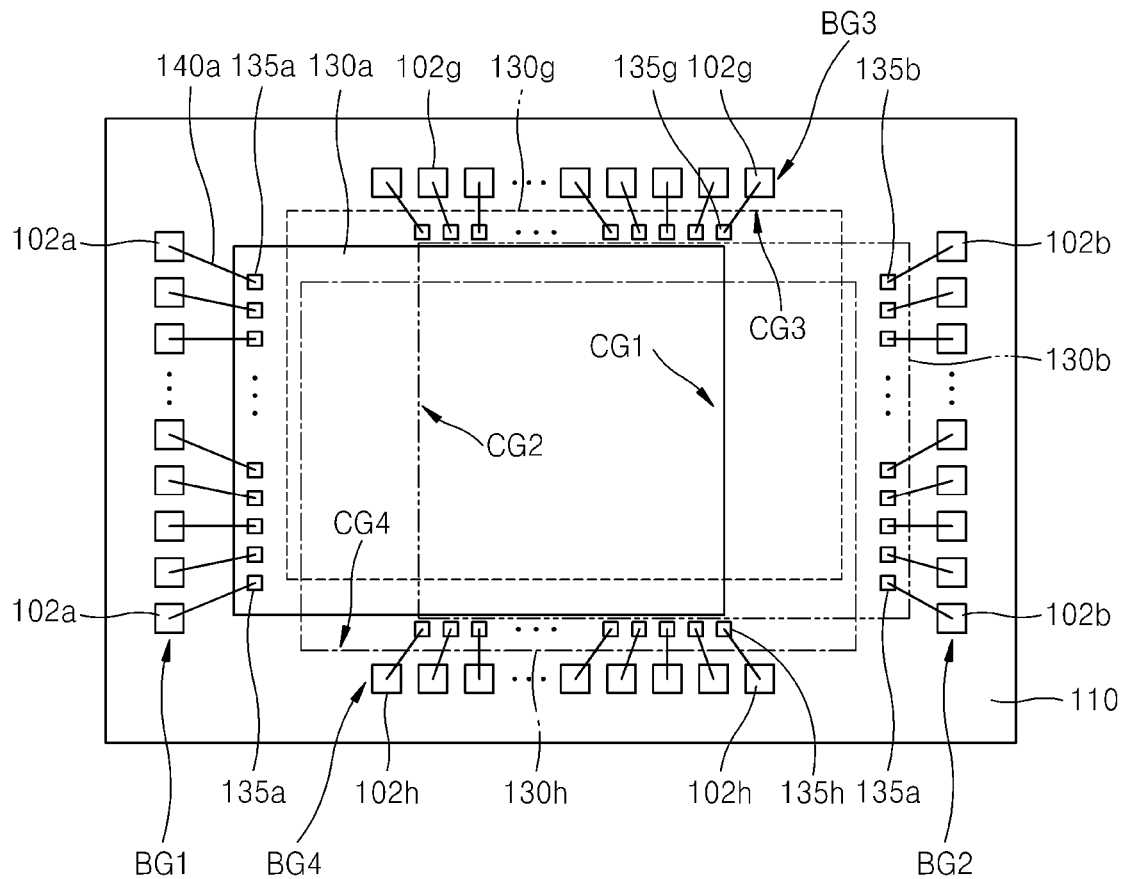
FIG. 9 illustrates a top view of an exemplary MCP.

FIG. 9 illustrates a top view of an exemplary MCP having four chip groups CG1, CG2, CG3, and CG4 stacked on package substrate 110, wherein each chip group has at least one chip and preferably multiple chips, such as four or eight chips. The chips within chip groups can be disposed in an offset fashion as shown in FIG. 5a and FIG. 5b, or other suitable ways, such as those discussed above with reference to FIG. 6, FIG. 7, and FIG. 8.

Four bonding pad groups BG1, BG2, BG3, and BG4 are provided on the package substrate 110. The four bonding pad groups are deployed around the major sides of the package substrate 110 (e.g. the four major sides of a rectangular package substrate). The chips of each chip group are electrically connected to the bonding pads of the corresponding bonding pad groups. For example, the chip(s) of chips groups CG1, CG2, CG3, and CG4 are respectively connected to the bonding pads of bonding groups BG1, BG2, BG3, and BG4. The chip(s) of each chip group can be electrically connected to the corresponding bonding pads in one of the methods as discussed above with reference to FIG. 1b, FIG. 5a, FIG. 5c, FIG. 6, FIG. 7, and FIG. 8.

Figure 10:
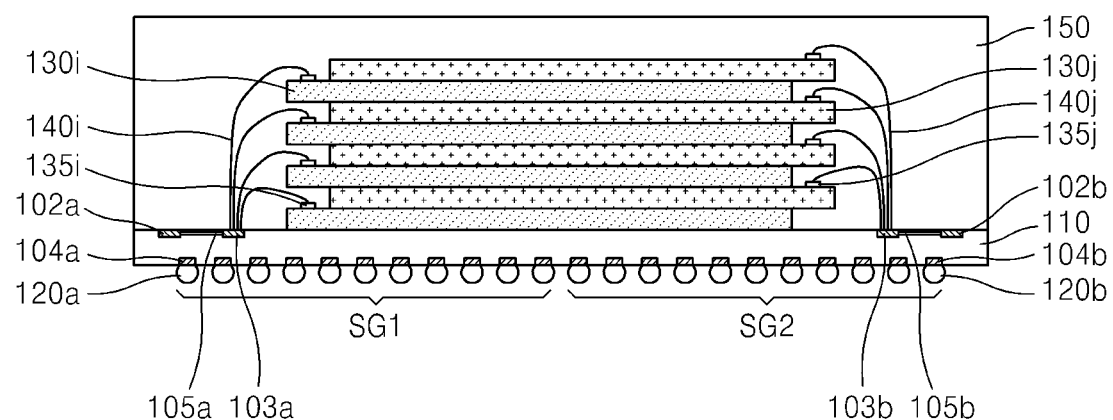
FIG. 10 is a cross-section of yet another exemplary MCP.
Figure 11:
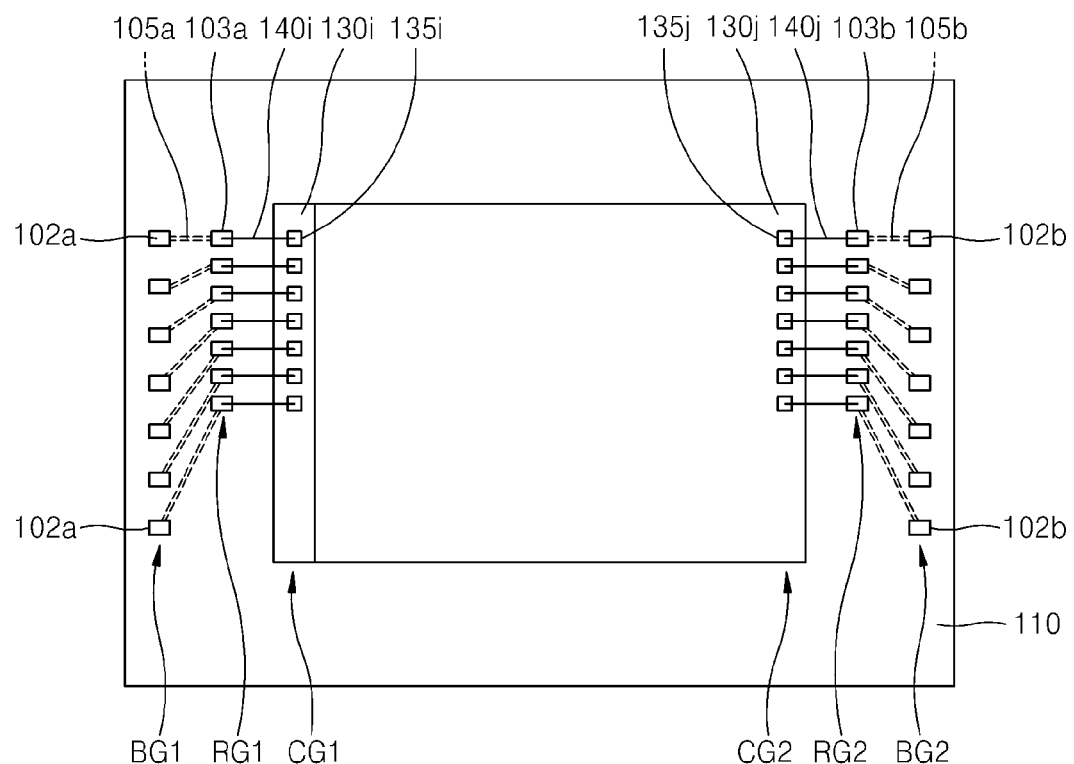
FIG. 11 illustrates a top view of another exemplary MCP.

FIGS. 10 and 11 illustrate another embodiment with chips chip groups CG1 and CG2 are stacked on the package substrate 110 in the same way as discussed above with reference to FIG. 6. However, chips can be stacked on the package substrate in other ways, such as discussed above with reference to FIG. 1b, FIG. 5a, FIG. 5c, FIG. 6, FIG. 7, and FIG. 8. As best shown in FIG. 11, the package substrate 110 includes two sets of bond pads for each chip group: RG1 and BG1 for chip group CG1 and RG2 and BG2 for chip group CG2. Each pad of RG1 is electrically connected to a corresponding pad of BG1. Similarly, each pad of RG2 is electrically connected to a corresponding pad of BG2. For example, pad 103a of RG1 is connected to corresponding pad 102a of BG1 by conductor 105a; pad 103b of RG2 is connected to corresponding pad 102b of BG2 via conductor 105b. Bond pad pairs (e.g., 103a/102a) are connected to a corresponding package terminal (e.g., solder ball 120a) in a manner similar to previous embodiments described above. The substrate wiring (not shown) connecting the bond pad pairs to the corresponding package terminal may connect to either bond pad or to some other point in their electrical connection.

As shown, the pads of each of pad groups RG1/RG2 are arranged in a more tightly packed formation then those of the pads of either or pad groups BG1/BG2. More specifically, a regular spacing between pads of each of pad groups RG1/RG2 is less than a regular spacing between pads of either of pad groups BG1/BG2. The pitch of pads of each of pad groups RG1/RG2 is less than the pitch of pads of either of pad groups BG1/BG2.

Referring to FIG. 11, chip pads of chips in chip group CG1 are electrically connected to bond pads (e.g. 103a) of pad group RG1 through wires (e.g. wire 140i) directly connected to bond pads of pad group RG1. Chip pads of chips in chip group CG2 are electrically connected to bond pads (e.g. 103b) of pad group RG2 through wires (e.g. wire 140j) directly connected to bond pads of pad group RG2. Chips of chip group CG1 are thus electrically connected to terminals of SG1, and chips of chip group CG2 are electrically connected to terminals of SG2. Other than the addition of the bond pad pairs (e.g., 102a/103a), the connection relationships of the chips of the chip groups to package terminals may thus be the same as described with respect to any of the above embodiments.

Figure 12:
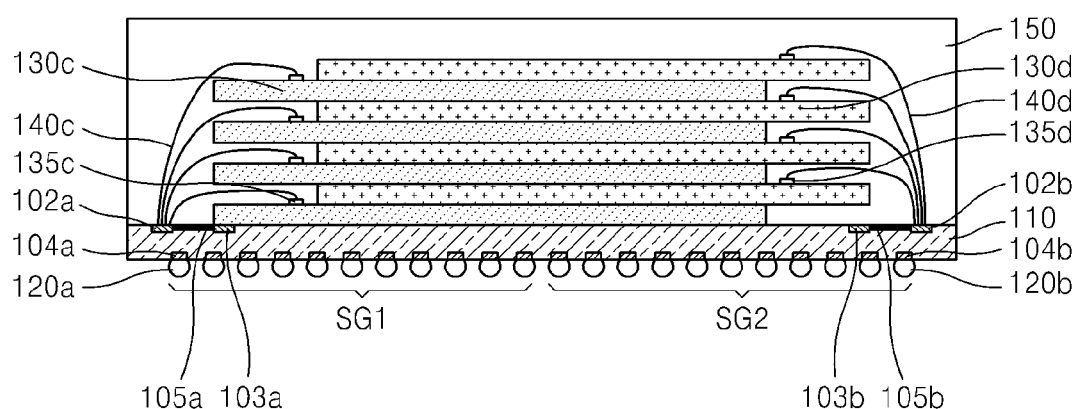
FIG. 12 is a cross-section of the MCP of FIG. 11.
Figure 13:
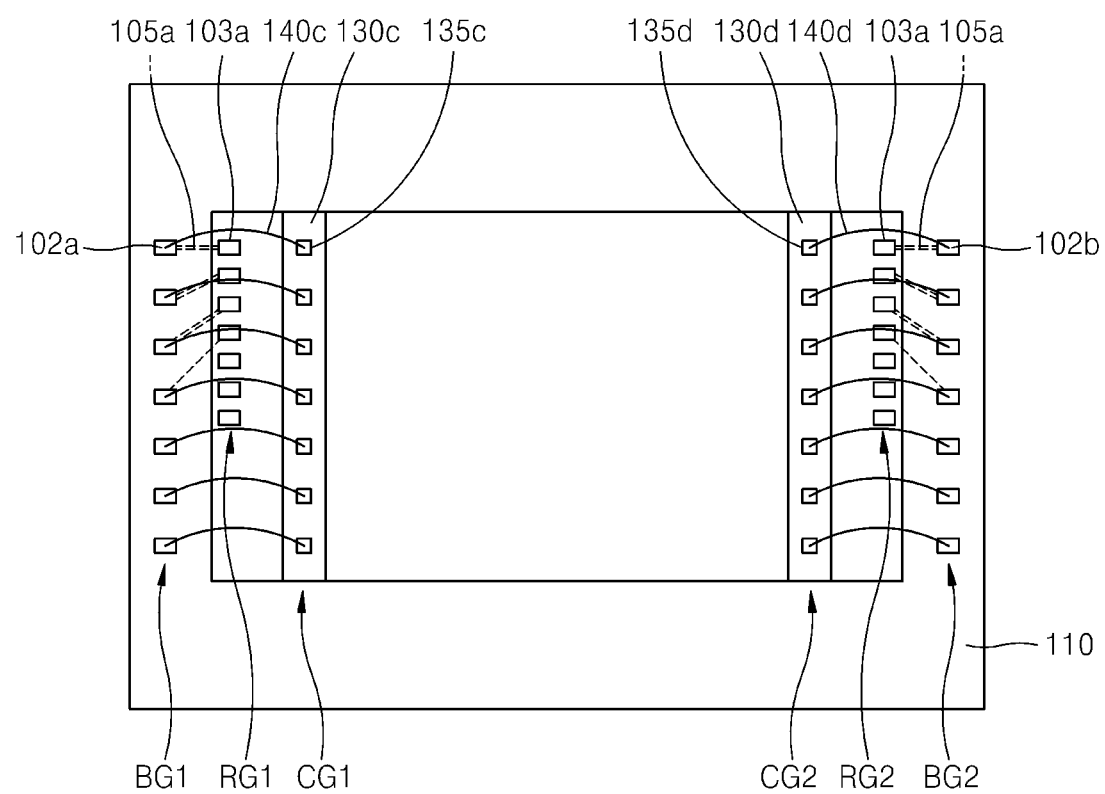
FIG. 13 illustrates a top view an exemplary MCP having the same package substrate of the MCP of FIG. 11.

In this example, one set of the two sets of bond pads (either BG1/BG2 or RG1/RG2) may be used for electrically connecting chips to the package substrate 110 wiring (and from there to the substrate terminals). FIGS. 10 and 11 illustrate an example where the chip group CG1 is connected to the package substrate 110 wiring via a wire bond connection to bond pads of RG1, and chip group CG2 is connected to the package substrate 110 wiring via a wire bond connection to bond pads of RG2. FIGS. 12 and 13 illustrate an example where the chip group CG1 is connected to the package substrate 110 wiring via a wire bond connection to bond pads of BG1, and chip group CG2 is connected to the package substrate 110 wiring via a wire bond connection to bond pads of BG2. The embodiment of FIGS. 12 and 13 also illustrate an example where chips of different sizes are used. In this example, the bottommost chips of each of chip group CG1 and CG2 are larger than the remaining chips of their chip group. Here larger bottommost chip 135c of chip group CG1 extends over and may be attached to pad 103a (e.g., through a non-conductive adhesive which attaches the entire chip 135 to substrate 110). The larger bottommost chip 135d of chip group CG2 extends over pad 103b in a cantilevered fashion. While different sized chips are shown in this example, it should be understood that this example may include chips of the same size, and that the other examples disclosed herein contemplate use of different sized chips.

As can be seen, with this configuration, chips of different types of chips may be used with the same package design. By providing multiple alternative package bond pads (each pair or group connected to the same package terminal), the connections between the chip groups and bond pads may be selected based on packaging requirements. Here, for example, the package bond pads may be selected so that the pitch or spacing between the package bond pads corresponds to (e.g., may be the same) that of the chip die pads to which they are connected. As such, wire bond distances may be kept short and/or substantially parallel (from a top down perspective) even when different chip designs (e.g., with different chip pad layouts) are used. As one particular example, chips used in the package of the embodiment shown in FIGS. 10 and 11 may be NAND memory chips designed for micro SD cards, while chips used in the package of the embodiment shown in FIGS. 12 and 13 may be a different type of NAND memory chips. From a user's perspective, the MCPs of these examples of both embodiments could be considered identical.

The above described embodiments are particularly applicable when using memory chips for chips of the chip groups (e.g., CG1, CG2). In such cases, the memory chips of the chip groups may be substantially identical (e.g,. from the same design, or different versions of the same design that from an external view, operate substantially identically). The memory chips may be volatile (e.g., DRAM) or non-volatile (e.g, NAND Flash memory, PRAM, RRAM, MRAM). However, the electrical connection schemes discussed above can also be implemented in MCPs having embedded therein other electronic components, such as a controller. When the chips of the chip groups are memory chips, the controller may be a memory controller and the MCP may be considered a memory card (either removable or an embedded memory card).

Figure 14A:
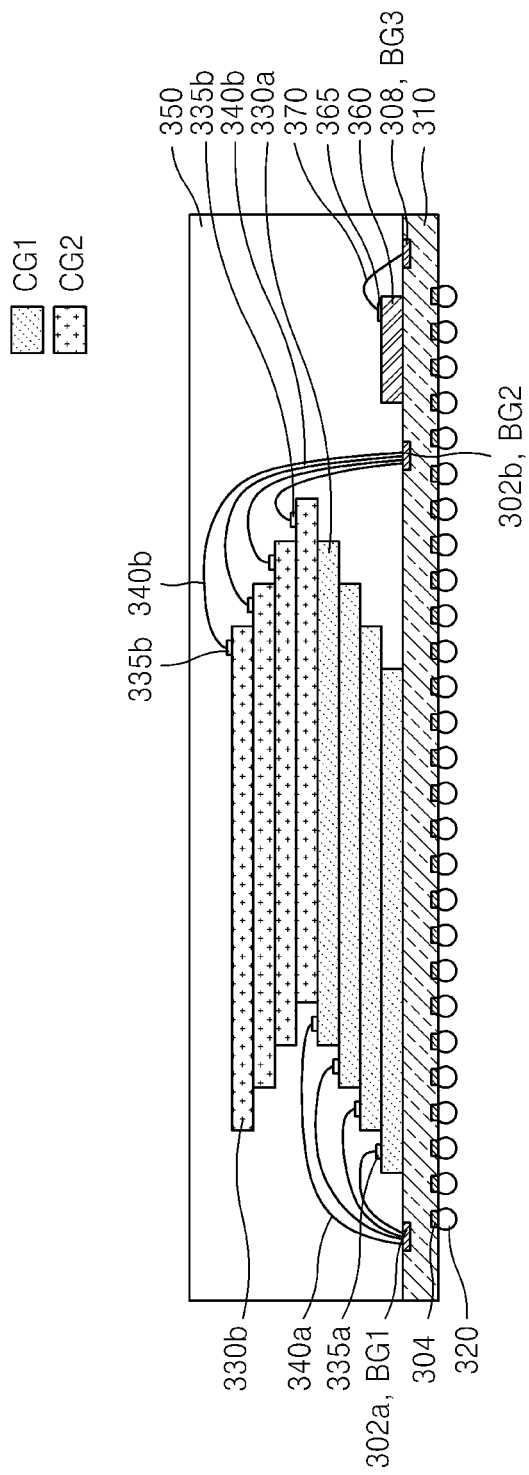
FIG. 14a is a cross-section of yet another exemplary MCP.

Referring to FIG. 14a, the chips of chip groups CG1 and CG2 are stacked on substrate 310 and electrically connected to the bonding pads (e.g. 302a of bonding pad group BG1 and 302b of bonding pad group BG2) on the package substrate 310 through bonding wires in the same way as those in FIG. 5a. A third chip 360 (e.g. a controller for controlling operation of the chips of chip groups CG1 and CG2) is disposed on package substrate 310.

Here, third chip 360 is connected to bonding pads of bonding pad group BG3 (including bonding pad 308). Third chip 360 connects via wiring connections in or on substrate 310 (not shown) to bonding pad groups BG1 and BG2 (e.g. 302a, 302b) to provide signal, power and/or ground communications to the chip groups CG1 and CG2. The wiring connections between the third chip 360 and bonding pad groups BG1 and BG2 are separate. The third chip 360 also is electrically connected to package terminals, such as solder ball 320 via wire connections to bonding pad group BG3 and substrate wiring. The chips of the chip groups CG1 and CG2 and the embedded third chip can be sealed in encapsulant 350, which can be resin, epoxy, EMC (elastic memory component) or other suitable materials. Rather than the dedicated wiring connections between the third chip 360 and the chip groups, some connections to chip groups may be shared, as described elsewhere in this disclosure with respect to connections between chip groups and package terminals.

FIG. 14b illustrates a top view of the MCP device in FIG. 14a. Referring to FIG. 14b, chips of CG1 and CG2 are electrically connected to the corresponding bonding pads (e.g. bonding pads 302a and 302b) through bonding wires (e.g. 340a and 340b). The bonding pads (302a and 302b) are electrically connected to the corresponding chip terminals of the third chip 360. The chip pads (e.g. 365) of the third chip 360 are electrically connected to the designated bonding pads (e.g. 308) which in turn are connected to corresponding package terminals, such as terminals 320 shown in FIG. 14a. Chip enable connections (nCE1, nCE2, nCE1' and nCE2') are the same illustrated and as discussed above with respect to 5b. Alternative chip enable connections may be provided, e.g., as discussed above with respect to FIGS. 5b and 26.

Figure 14C:
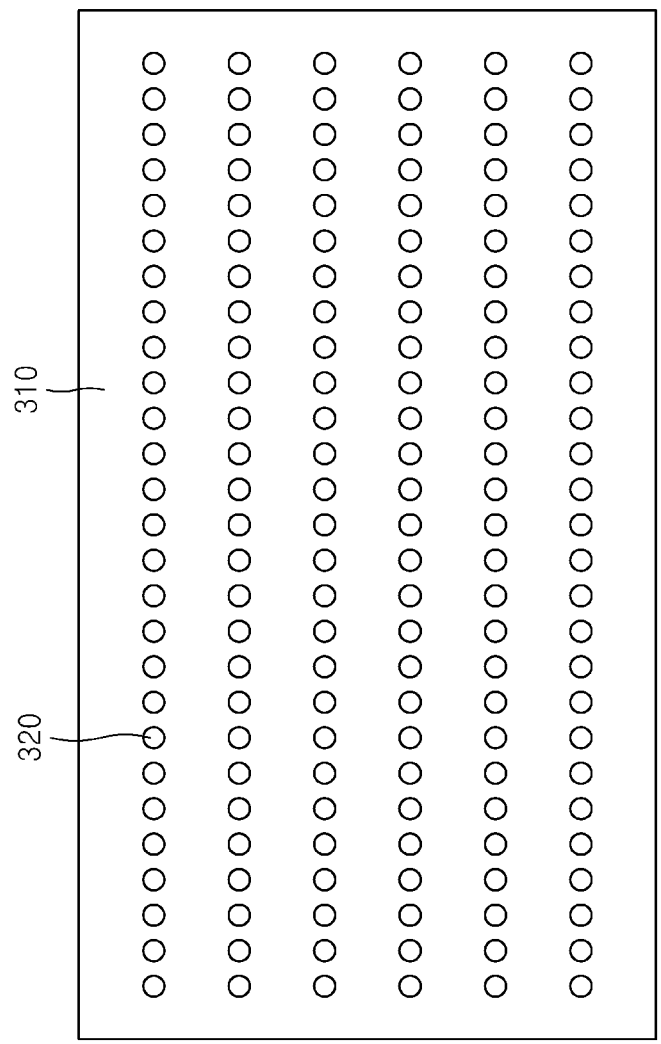

In contrast to the above described embodiments, the package terminals need not be unique to a particular chip group. Rather, the package terminals may all be shared for communications with all of the chips of the MCP. The backside of the package substrate 310 is illustrated in FIG. 14c wherein solder balls 320 may be used for electrical communications with all of the chips of the chip groups CG1 and CG2. The advantages and dedicated connections may still be present in the embodiment however. Specifically, the dedicated connections described with respect to the above embodiments are provided between the controller 360 and the chip groups CG1 and CG2. The controller 360 has separate terminal connections to each of the separate chip groups in a manner similar to the separate package terminal connections to the separate chip groups as described with respect to the previous embodiments. The controller 360 therefore communicates/controls chip groups using these separate connections, but then uses the same wiring/package terminals to relay control and/or information of all chip groups with the exterior of the package.

In the embodiment of FIGS. 14a, 14b and 14c, the third chip 360 (controller chip) is shown spaced apart from the stack of chips of chip groups CG1 and CG2. However, the third chip may be part of the stack of chips. In addition, rather than wire connections to a package substrate and then to the third chip 360, electrical connections may be made directly to pads on the third chip 360 or to an interposer layer (e.g., inserted between the third chip 360 and the stack of chips of the chip groups). In addition, the electrical connections may be TSV connections, such as those described with respect to FIG. 8. In addition, when the third chip 360 is a memory controller, and the chips of the chip groups are memory chips, the third chip may also include a memory portion. In this case, when the memory of the controller chip is of the same size as that of the memory chips of the chip groups, the third chip 360 may be larger in size than that of the memory chips of the chip groups. Thus, the stack of memory chips of the chip group may be placed on the third chip 360. In this instance, instead of or in addition to TSV connections similar to FIG. 8, the extra size of the third chip 360 may be used for wire bonding to bond pads on the upper surface of the third chip 360 where the stack of memory chips is not placed.

Figure 15:
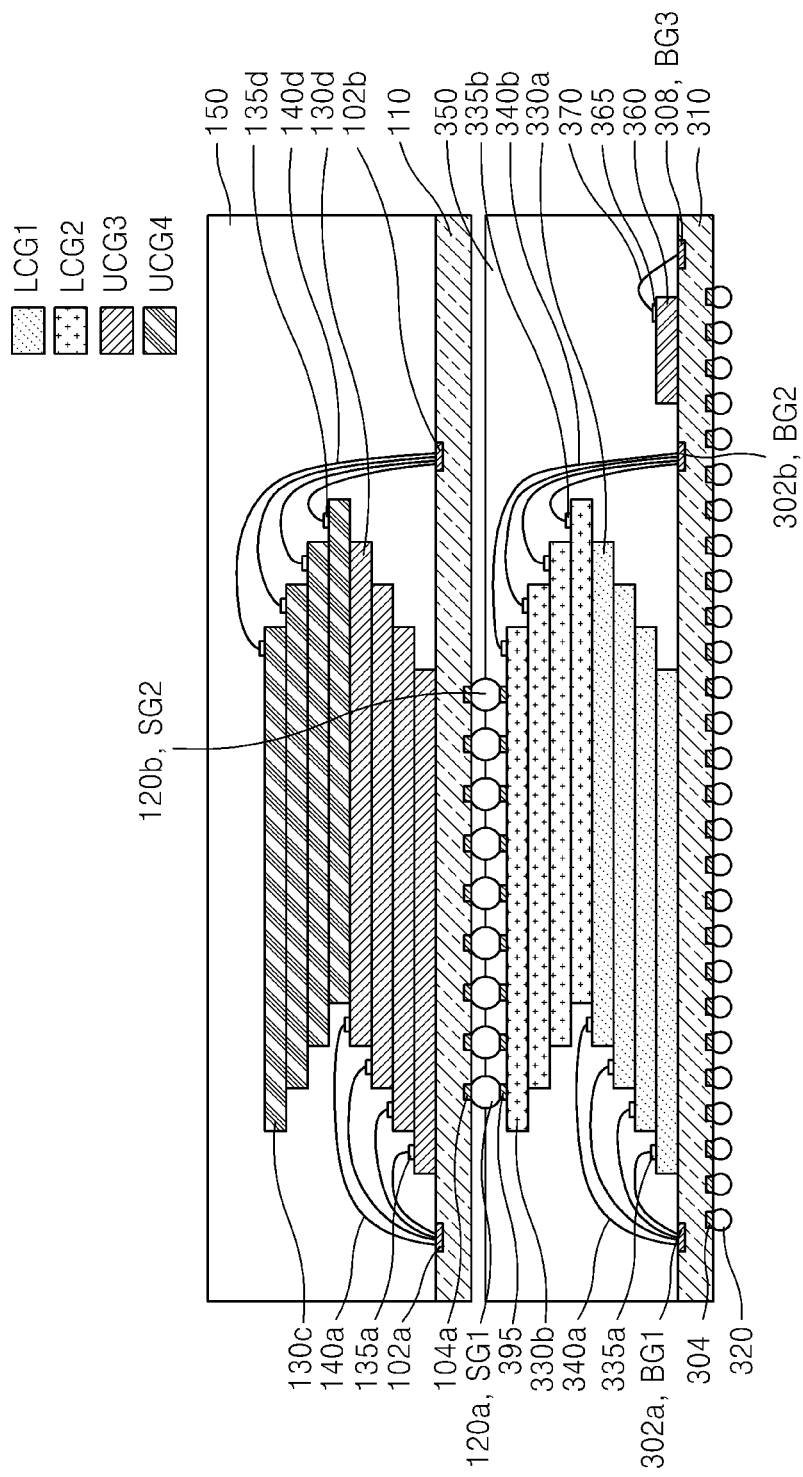
FIG. 15 is a cross-section of a package on package system including two MCPs.
Figure 16:
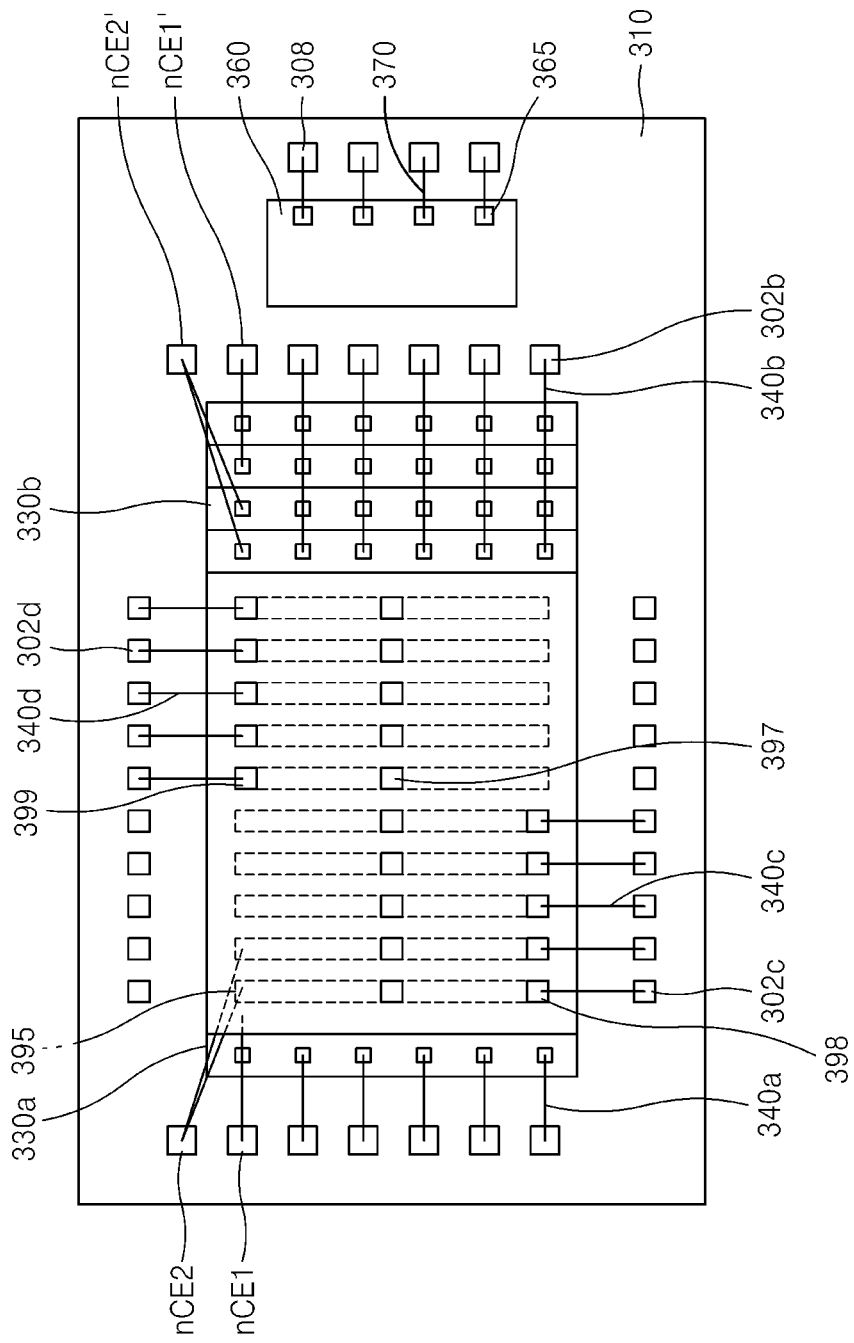
FIG. 16 illustrates a top view of an exemplary MCP forming the lower MCP of the package on package of FIG. 15.
Figure 17:
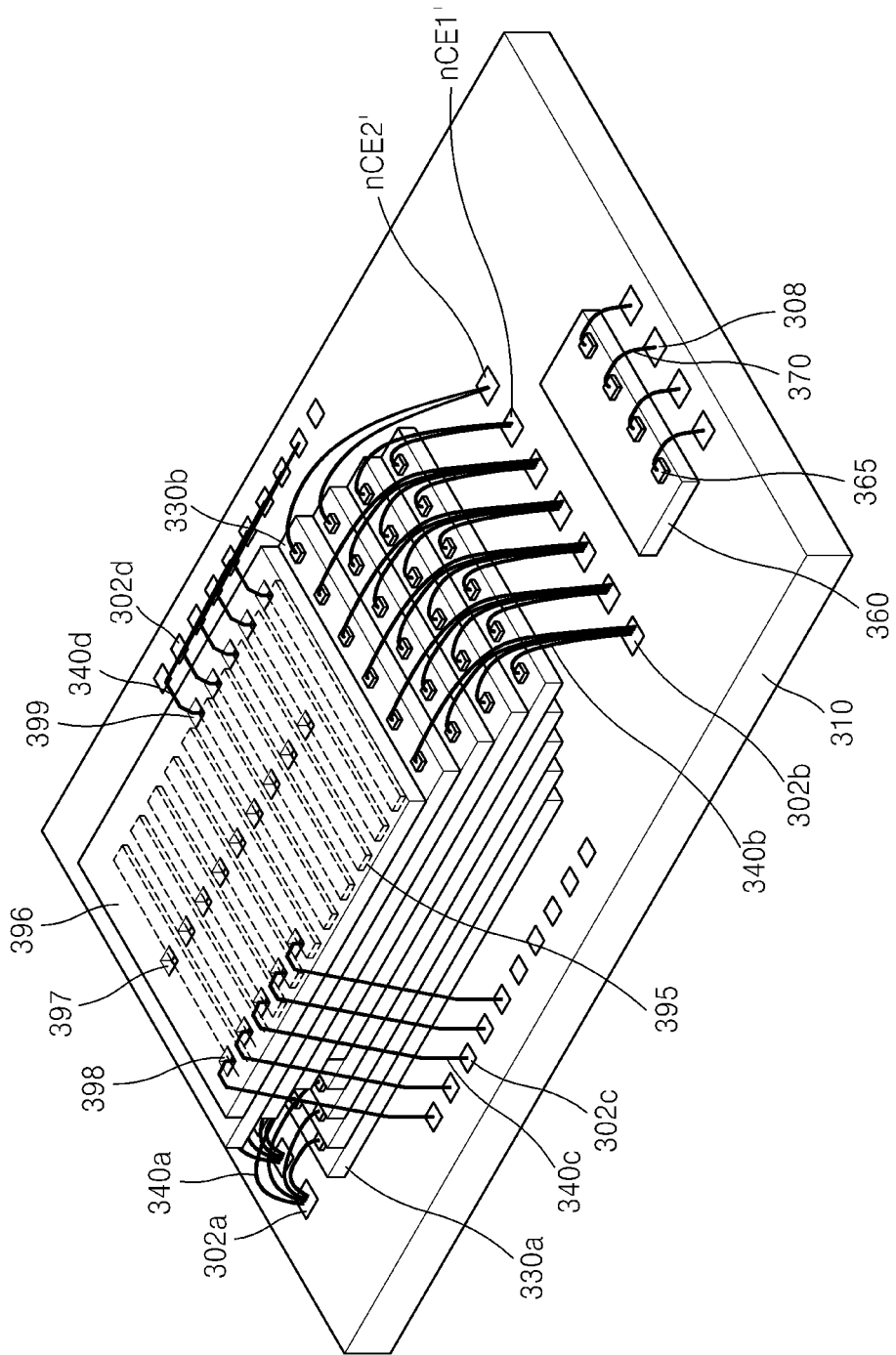
FIG. 17 illustrates a perspective view of the MCP of FIG. 16.

The electrical connection schemes discussed can be implemented in a package-on-package (POP) system, an example of which is illustrated in FIG. 15, FIG. 16 and FIG. 17. Referring to FIG. 15, the POP comprises an upper MCP and lower MCP. The upper MCP includes upper chip groups UCG3 and UCG4 stacked on package substrate 110 and encased by encapsulant 150. The upper MCP in this example is the same as that illustrated in and described above with respect to FIGS. 5a and 5b and its description need not be repeated here.

The lower MCP comprises lower chip groups LCG1 and LCG2 stacked on substrate 310 and encased by encapsulant 350. The lower MCP in this example has similar structure to the MCP example illustrated in and described above with respect to FIGS. 14a, 14b and 14c. In addition to the structure described above with respect to the MCP of FIGS. 14a, 14b and 14c, the lower MCP includes the following electrical connections to connect the upper MCP chip groups UCG3 and UCG4 to controller 360.

FIG. 16 is a top down view and FIG. 17 is a perspective view of the lower MCP of the POP of FIG. 15. Conductive lines (e.g. 395) are formed in the top surface of the top chip 330b of the lower MCP. The conductive lines 395 are covered by an insulating layer 396, such as a chip passivation layer, for protection. The conductive lines 395 may be formed simultaneously with the formation of the chip pads, such as by patterning a metal layer from which the chip pads and conducive lines 395 are formed. The conductive lines 395 on the top surface of chip 330b are not electrically connected to the remainder of chip 330b (i.e., there are no signal connections or power/ground connections to circuits formed in chip 330b). Multiple openings of the insulating layer are made so as to expose portions of the conductive lines at the desired locations. The package terminals (e.g. 120a of SG1 and 120b of SG2) of the upper MCP are electrically connected to the conductive lines of the lower MCP through the openings (e.g. 397) of the insulating layer. Bonding wires 340c electrically connect conductive lines 395 through the openings 398 and 399 at the ends of the conductive lines to bonding pads 302d and 302c on the lower package substrate. Thus, electrical connections are provided between the chips of the upper chip groups UCG3 and UCG4 of the upper MCP and the package substrate 310 of the lower MCP. Detailed examples of using conductive lines in MCPs are set forth in co-pending U.S. patent application, Ser. No. 12/575,586, filed Oct. 8, 2009, the subject matter of which is herein incorporated by reference in its entirety.

Substrate wiring (not shown) in package substrate 310 further connect the chips of the upper chip groups UCG3 and UCG4 to controller 360 in a manner similar to the connections of lower chip groups LCG1 and LCG2 (described above with respect to the example of FIGS. 14a, 14b and 14c) and from there communicate to systems outside the POP via terminals 320. All of the chip groups therefore may share the same terminals 320 for external communications.

Alternatively, the POP of FIGS. 15, 16 and 17 may not include a controller 360. In such case, the lower package may include a connection scheme of the embodiments described above without the controller with the additional electrical connections to connect the upper MCP chip groups UCG3 and UCG4 to substrate 310 of the lower MCP. The substrate wiring in this alternative may connect the chip groups via dedicated sets of package terminals, each set being dedicated to a corresponding chip group.

Other variations of the POP will also be apparent. For example, more than two MCP's may be stacked in a POP formation. In addition, it will be apparent that the chip arrangements within each MCP may be modified other than that shown in this particular example, including those MCPs illustrated in FIG. 1b, FIG. 5a, FIG. 5c, FIG. 6, FIG. 7, and FIG. 8.

The electrical connections schemes and chip configurations as discussed above, as well as variations, can be implemented in various card systems and electronic system. Exemplary such card systems include, but not limited to, multi media cards (MMCs) and secure digital cards (SD cards). The electronic systems can be mobile phones, MP3/MP4 players, navigation systems, solid-state disks (SSDs), house-hold appliances, or many other electronic systems.

Figure 18A:
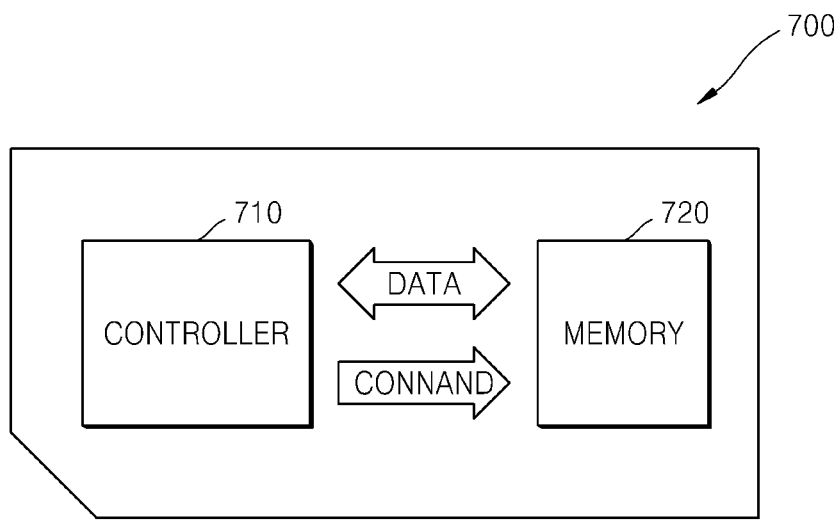
FIG. 18a is a diagram of an exemplary memory card.

Referring to FIG. 18a, a memory card 700 comprises controller 710, and memory 720. The electrical connection arrangement between the memory 720 and controller 710 may be the same as that described above with respect to embodiments including a controller (with respect to FIG. 14a, FIG. 14b, FIG. 14c, FIG. 15, FIG. 16, and FIG. 17). In this instance, the chips of the chip group would comprise memory chips, such as non-volatile memory chips (e.g., NAND, RRAM, PRAM, MRAM) or may include volatile memory (e.g., DRAM, SRAM). The memory chips and controller may have the same physical arrangement as that described herein.

Figure 18B:
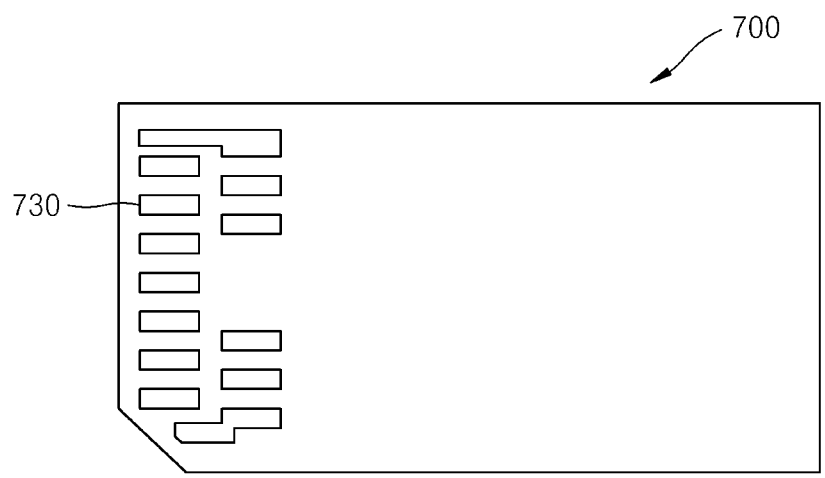

Rather than package the controller and memory chips into a single MCP, the controller may be separately provided in the memory card with an MCP without a controller (or with an additional controller). The electrical connection arrangement and/or physical arrangement of the chips within such an MCP may be the same as any of the embodiments described herein. The MCP may then be connected to the controller on a card substrate, which in turn is encased, such as with an encapsulant or plastic housing. FIG. 18b illustrates memory card terminals to provide communication to the memory chips of memory 720 via controller 710.

Figure 19:
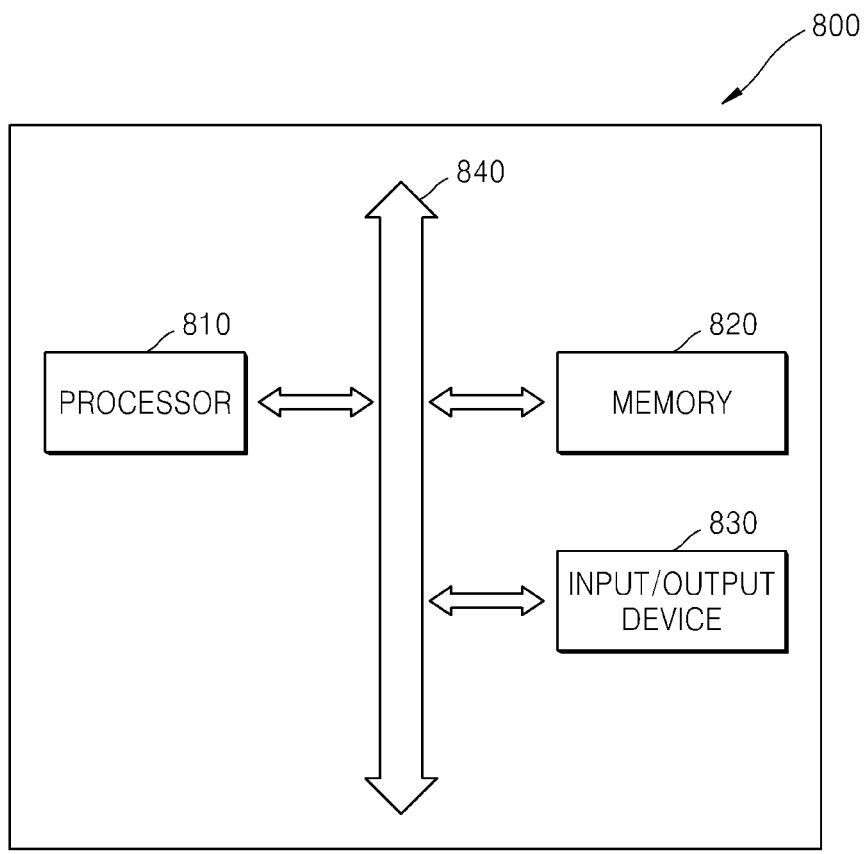
FIG. 19 is a block diagram of an electronic system.

An exemplary electronic system 800 is illustrated in FIG. 19 comprising processor 810, memory 820, input/output device 830, and bus 840. The memory, I/O device 830 and processor 820 communicate through bus 840. The I/O device 830 interfaces with the external system to provide signals and power to the processor 810. The processor 810 receives and processes signals transmitted from the I/O device 830 and communicates with memory 820. Memory 820 may be any of the MCPs described herein where the chips in the MCP are memory chips. The processor can be embedded in the MCP, such as discussed above (e.g., with reference to FIG. 14a, FIG. 14b, FIG. 14c, FIG. 15, FIG. 16, and FIG. 17). The processor may also be an additional processor than a separate controller embedded in the MCP. In such a case, it may be desirable that the controller embedded in the MCP is a memory controller and the processor may be chosen based on the particular electronic system (e.g., a microprocessor for a general purpose computer, a DSP for a communications device, etc.).

Figure 20:
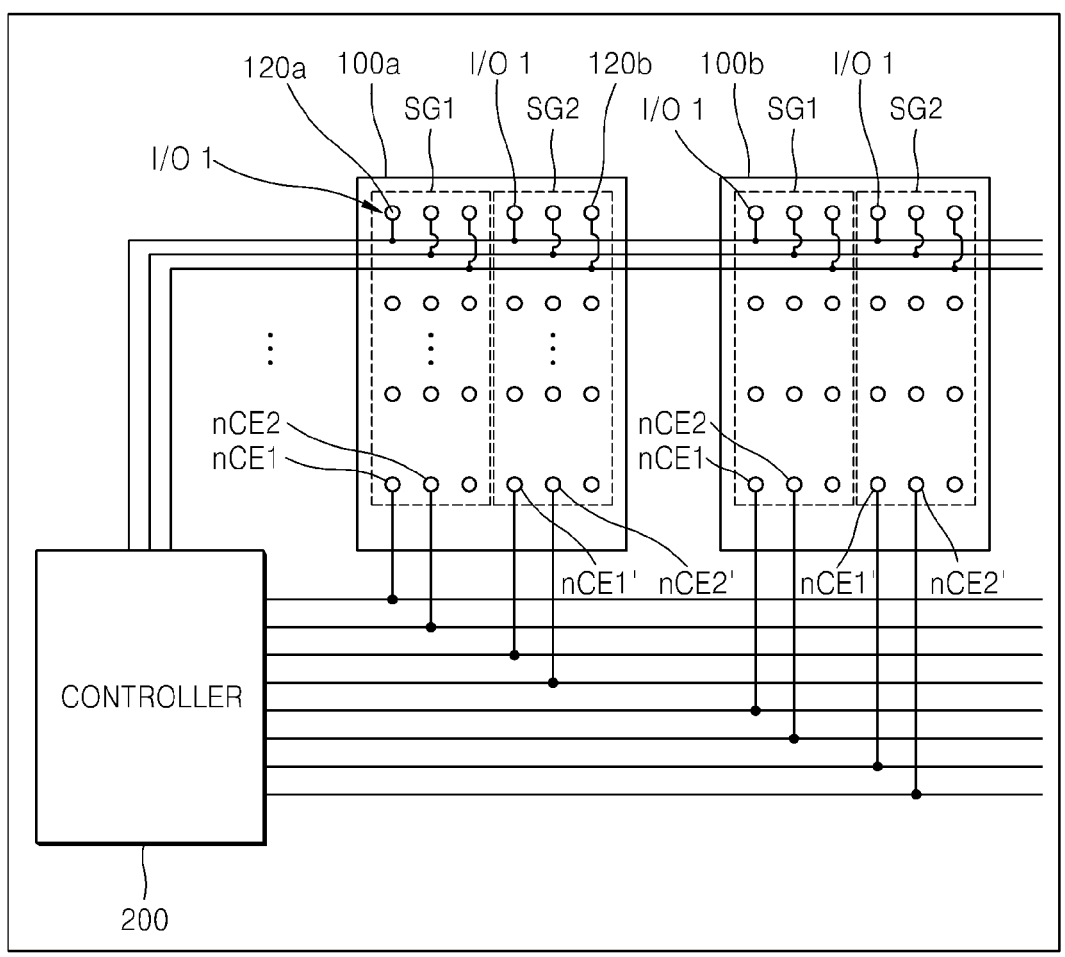
FIG. 20 is illustrates an exemplary system including a controller and several MCPs.
Figure 21:
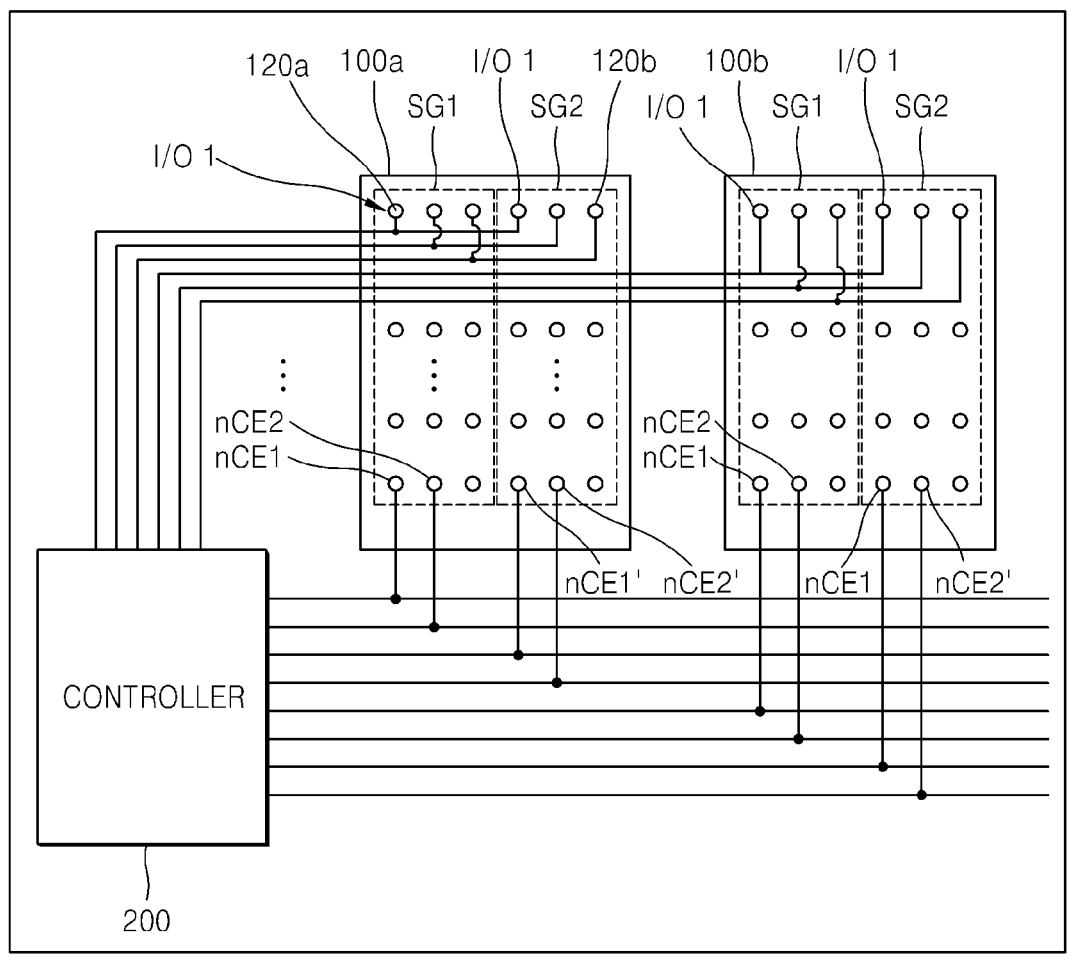
FIG. 21 is illustrates another exemplary system.
Figure 22:
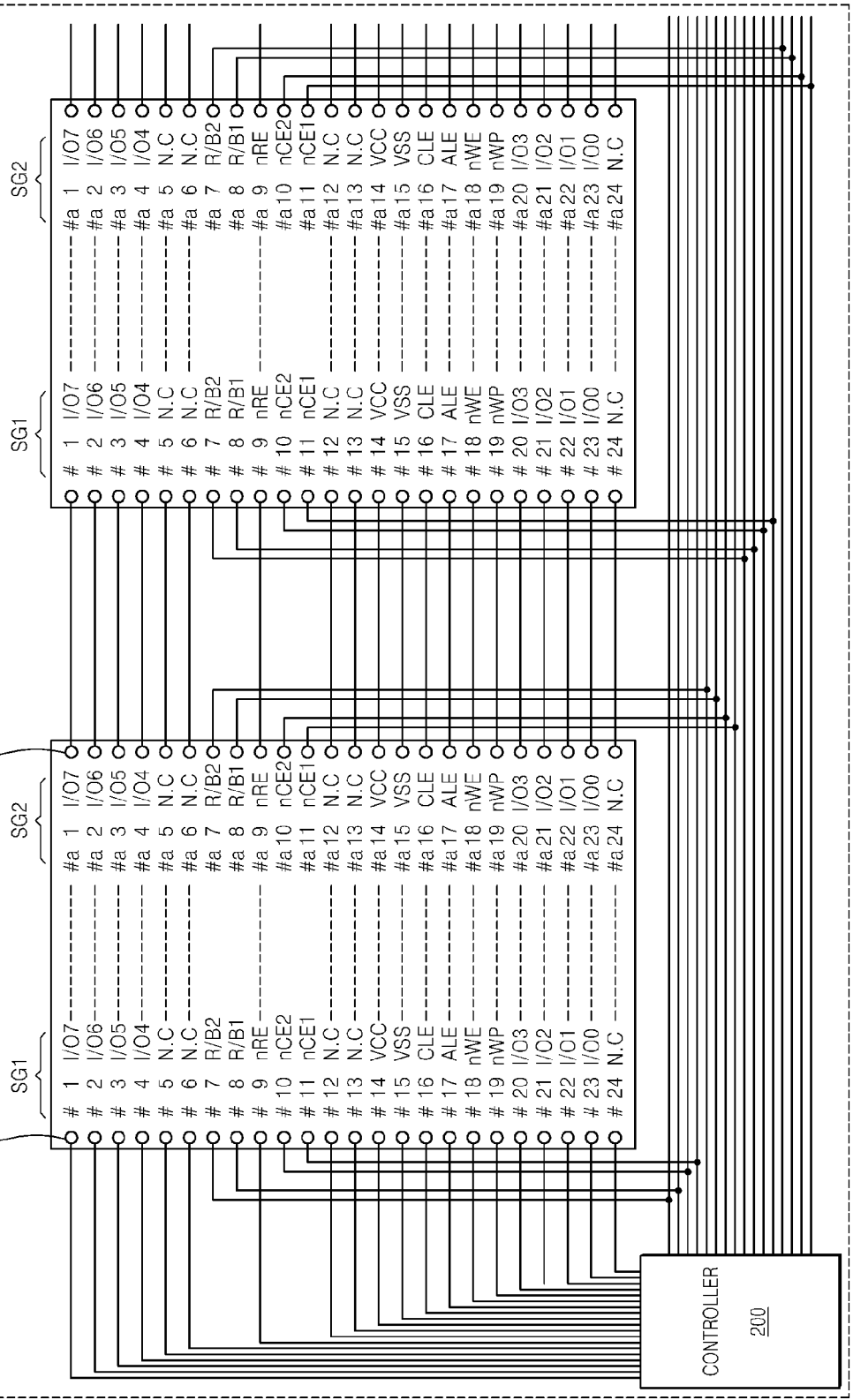
FIG. 22 is a diagram showing details of another exemplary system.

FIGS. 20, 21 and 22 illustrate various exemplary connections between a controller and MCPs on printed circuit board. The systems illustrated in FIGS. 20, 21 and 22 may be part of a memory module, a solid state disk (SSD) or a particular electronic system, such as forming a part of electronic system 800 in FIG. 19. Chips of plural MCPs (here, two MCPs 100a and 100b are shown) are electrically connected to controller 200. Each MCP comprises multiple chips organized into separate chip groups, as discussed above. Each of the chip groups in each MCP has package terminals dedicated to the chip group (not shared with other chip groups in the package). Here, each of MCP 100a and 100b include two sets of package terminals SG1 and SG2 dedicated to chip groups CG1 and CG2 internal to the package (not shown in FIGS. 20, 21 and 22) which may have electrical connection arrangements and/or physical arrangements of the MCPs described herein. The following system description applies to MCP embodiments described herein where package terminal groups are dedicated to individual chip groups.

In the embodiments of FIGS. 20 and 21, two sets of package terminals SG1 and SG2 have same functional terminals and are provided on each package substrate with translational symmetry, such as described above with respect to FIG. 20 (although other terminal arrangements are also contemplated, including those described herein). Certain package terminals on the same package having the same function are connected together by wiring on the system substrate (e.g, patterned conductors on the printed circuit board). Certain package terminals of different packages having the same function are connected together with wiring on the system substrate. For example, FIG. 20 shows four I/O1 terminals (two on each of the MCPs 100a and 100b) being connected in common with a single wiring for communication to controller 200. Thus, while these common functional terminals have no electrical connections within either package 100a or 100b (each common functional terminal being dedicated to separate respective chip groups, as described above), they are connected outside the package.

Other package terminals have a dedicated wiring connection to the controller 200, even though they have a common function. FIG. 20 illustrates chip enable package terminals (nCE1, nCE2, nCE1' and nCE2') having dedicated connections to controller 200. This latter group of package terminals (e.g., nCE) have no shared signal connections within the package nor outside the package.

FIG. 21 illustrates a system level connection scheme similar to that of FIG. 20. FIG. 21 differs from FIG. 20 in that common functional package terminals of the same MCP are connected together on the system substrate (e.g., printed circuit board) but those same common functional package terminals of a different MCPs are not connected together on the system substrate. For example, two IO1 package terminals of MCP 100a are connected with a single wiring, while a separate wiring is used to connect two IO1 package terminals of MCP 100b.

FIG. 22 illustrates another example of system level use of the MCP's described herein. Similar to FIGS. 20 and 21, FIG. 22 illustrates two MCPs, each with two sets of common functional package terminals (SG1 and SG2). FIG. 22 shows that the common functional package terminals SG1 and SG2 are arranged on the package substrate in a line symmetrical arrangement with respect to each other. The wiring scheme of the printed circuit board of FIG. 22 is similar to that shown in FIG. 20. Certain package terminals having the same function (on the same MCP and different MCPs) are connected together with wiring on the system substrate. Specifically, each package terminal having one of the following functions is connected together to respective ones of other package terminals: I/O0-I/O7, nRE, Vcc, Vss, CLE, ALE, nWE, and nWP. While these common functional terminals have no electrical connections within the package (being dedicated to separate respective chip groups, as described above), they are connected outside the package (e.g., becoming a single electrical node, such as with a patterned conductive wire on a printed circuit board). N.C. (not connected) package terminals are not connected to any chip within the package, and thus may not be considered to be dedicated to any chip group of the package. N.C. package terminals should not be confused with N.C. chip pads or N.C. chip terminals, which may serve different functions, as is understood in the art. As shown in FIG. 20, N.C. package terminals may also be connected in common with the printed circuit board wiring. The printed circuit board wiring of the system substrate may extend underneath the packages (represented by the dashed lines in FIG. 22) to provide these electrical connections. Other package terminals have a dedicated wiring connection to the controller 200, even though they have a common function, such as R/B 1, R/B 2, nCE 1, and nCE 2. This latter group of package terminals (e.g., R/B and nCE) have no shared electrical connections (e.g., connected as a common node) within the package nor outside the package. Exemplary details of the R/B pads and corresponding functions may be found in U.S. Pat. No. 5,822,251, the entire contents of which are hereby incorporated by reference.

Figure 23:
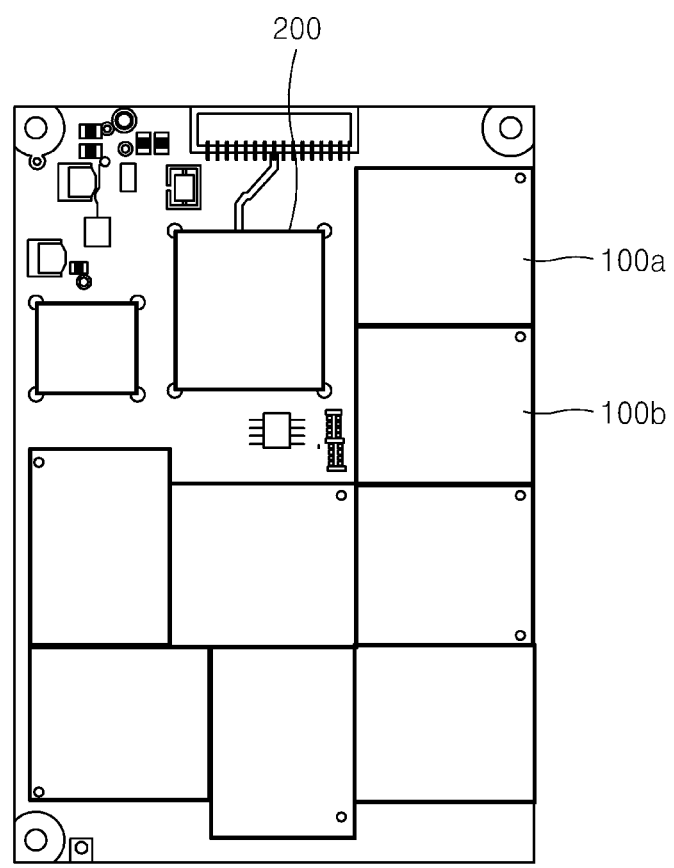
FIGS. 23, 24 and 25 illustrate details of solid state drive embodiment.
Figure 24:
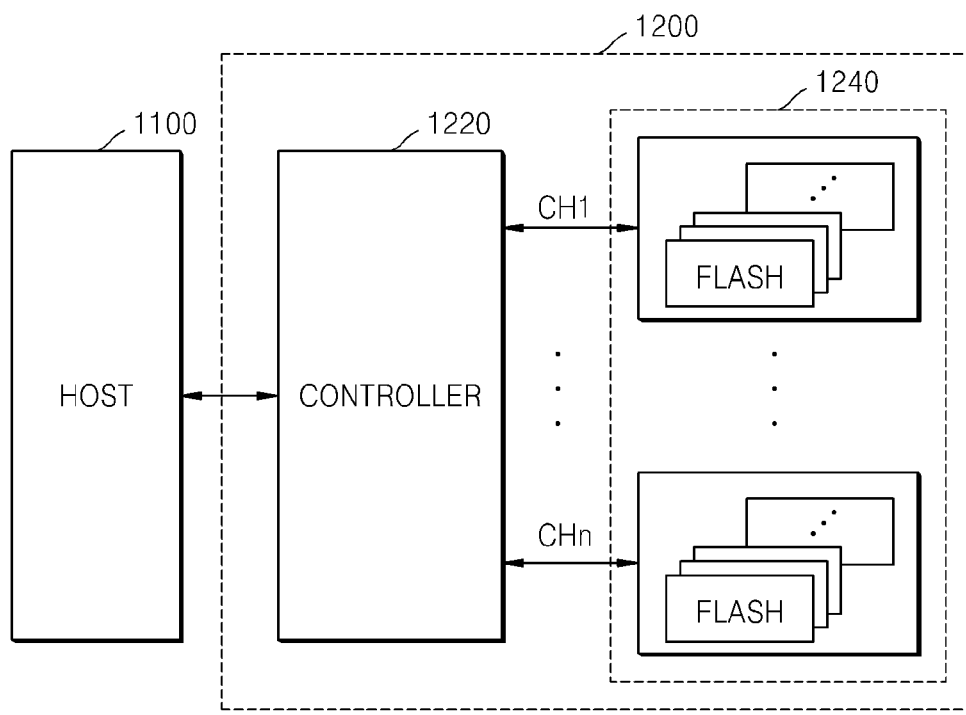
Figure 25:
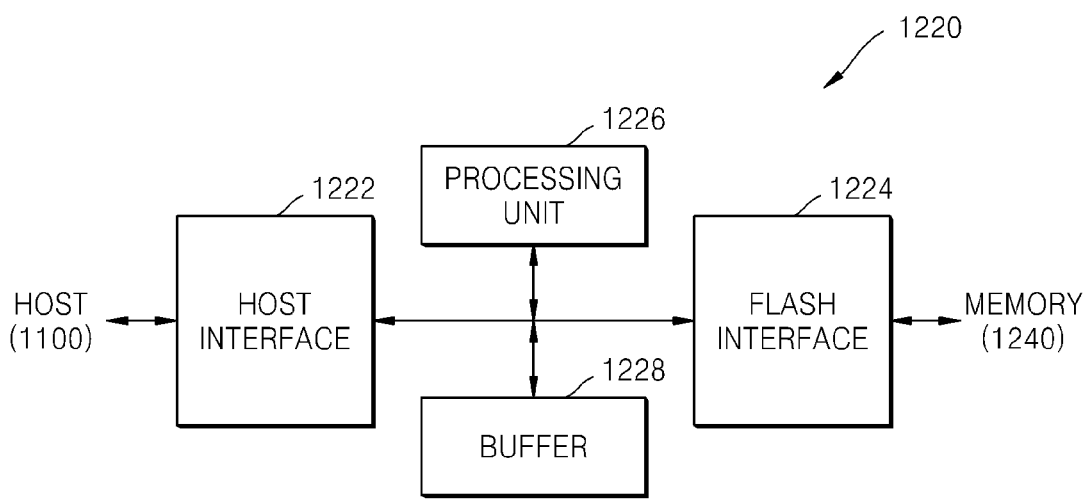

FIGS. 23, 24 and 25 illustrate exemplary systems implementing the MCPs described herein, which are particularly suited for taking advantage of the benefits of such MCPs. FIG. 23 illustrates a solid state disk (SSD) layout, including MCPs 100a and 100b and controller 200, which may be implemented with any of the embodiments of FIGS. 20, 21 and 22.

FIG. 24 illustrates a block diagram of a computer system 1000, including solid state disk 1200 and host 1100. Solid state disk 1200 comprises controller 1220 and flash memory unit 1240. The flash memory unit 1240 comprises multiple MCPs, such as those described herein. The individual chips of the MCPs may be NAND flash memory chips in this example, but may be other non-volatile memory, such as PRAM, MRAM, RRAM or volatile memory (e.g, DRAM, SRAM). Here, each flash MCP communicates with the controller 1220 through a separate channel (e.g. CH1 and CH2), however different connection schemes may be employed, such as those described herein with respect to those embodiments including controllers. The solid state disk 1200 may be of the removable type (such as described above with respect to FIGS. 18a and 18b), so that it may be manually inserted into and removed from the host 1100. Alternatively, the solid state disk 1200 may be fixed to the host via solder ball connections to a circuit board of the host 1100.

FIG. 25 illustrates details of controller 1220 including processing unit 1226, host interface 1222, buffer 1228, and flash interface 1224

FIG. 26 illustrates an alternative chip enablement scheme which may be implemented to select a particular one of the chips within the MCP for access. In particular, the chip enablement scheme described above (e.g, with respect to FIGS. 14b and 5b) contemplates a single dedicated chip enablement CE connection from either controller 360 or from a CE package terminal to one chip or to multiple chips (e.g, acting as a single chip). When a chip enable connection CE is provided to multiple chips in the above embodiments, the multiple chips may act as a single chip, both being enabled for access by the same CE signal, but only one providing access due to different addresses of the chips. In the above embodiments, when the single dedicated chip enable signal is active, the single chip or multiple chips connected are enabled (and may become active).

In contrast, FIG. 26 illustrates plural CE signals provided in common to multiple chips. The MCP of FIG. 26 may have the same structure as the embodiment of FIGS. 14a and 14b, but have the following chip enablement scheme. Here, nCE1 and nCE2 are provided to all chips of chip group CG1, while nCE1' and nCE2' are provided to all chips of chip group CE2. Only one chip of each chip group is enabled at any one time. To determine which chip is enabled, each chip includes a decoder to decode the respective two chip enable signals received.

Figure 27A:
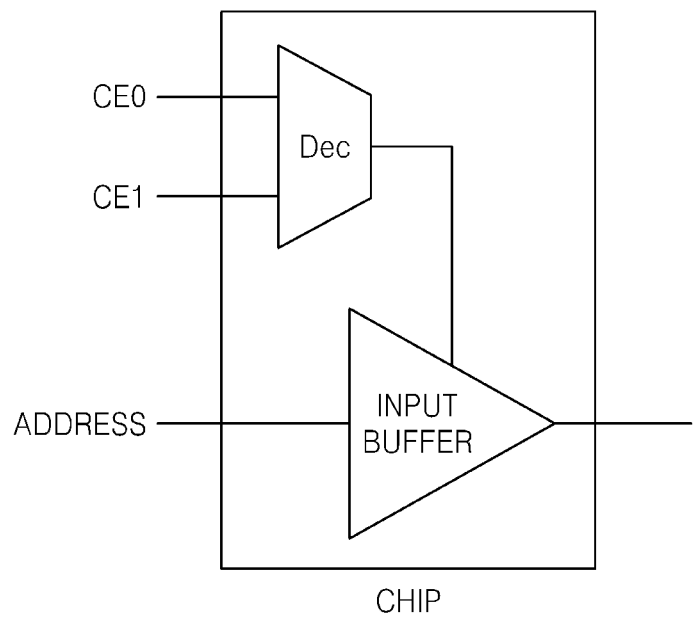

FIG. 27a illustrates an example where the chip includes a decoder Dec to decode CE0 and CE1 (in contrast, the chip enable scheme of FIGS. 14b and 5b, the chip enable signal/logic nCE may be directly connected to an address input buffer). Upon decoding the correct combination of CE0 and CE1 signals, the chip is enabled. For example, the input buffer of the chip is enabled, such as by providing power to the buffer (which may be an amplifier or inverter). Here, the input buffer is shown as an address input buffer, such that when the chip is enabled by decoding the correct combination of CE0 and CE1, the chip is able to input an address (such as a memory address, to determine where to store data).

Figure 27B:
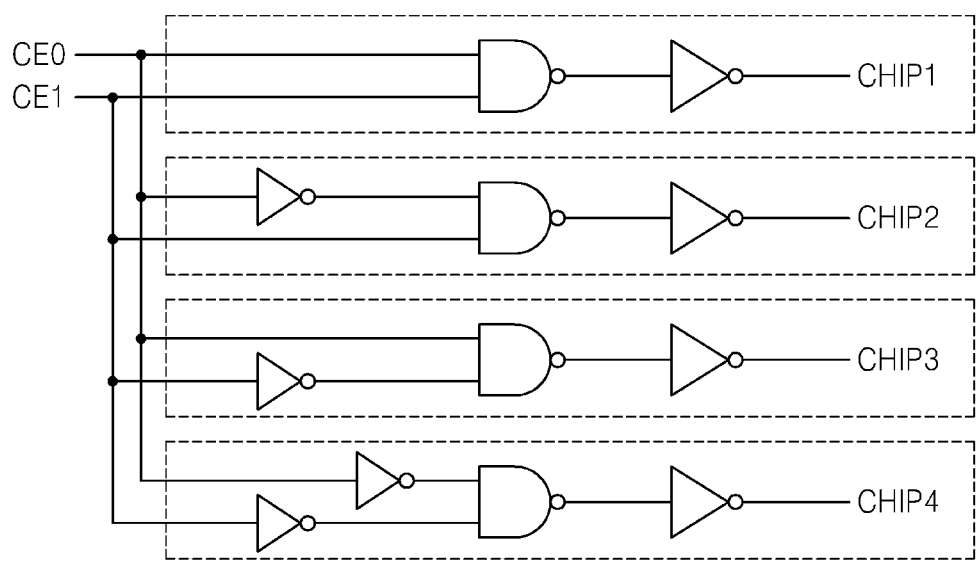
Figure 28:
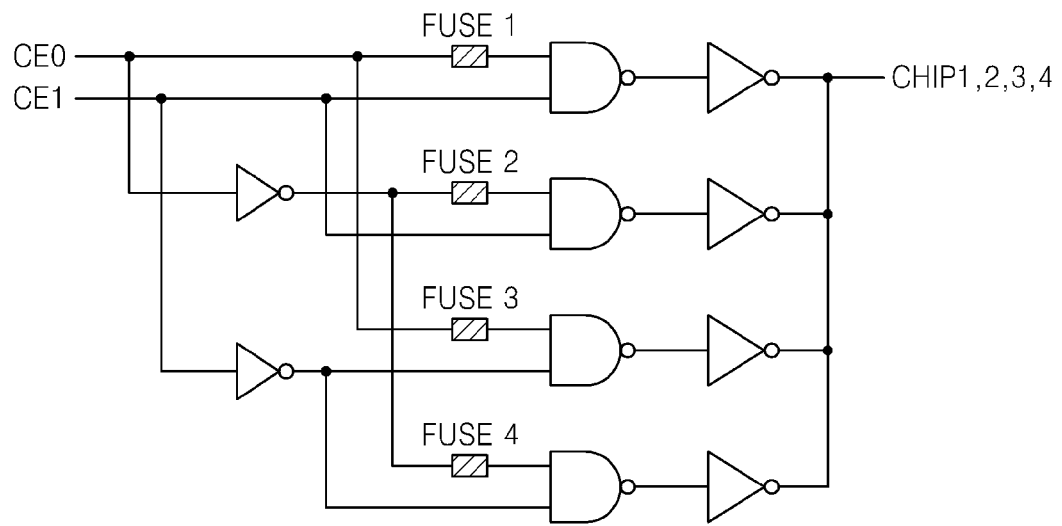

FIGS. 27b and 28 illustrate exemplary circuits for implementing the decoder of FIG. 27a. In FIG. 27b, each chip is designed with a different circuitry to provide a different decoding result for the four possible CE0/CE1 logic combinations (i.e., 00, 01, 10, 11). In the example of FIG. 28, each chip is initially manufactured with the same design, each including four decoders (as identified in FIG. 27b). However, only one of the decoders is made active through the use of fuses (fuses 1 to 4). For example, by burning a fuse, the NAND gate associated with the fuse may operate as if the fuse signal is a logic low. In such case, the NAND gate output associated with a burned fuse will always be high, and the corresponding inverter connected to such NAND gate will always output a logic low signal. Thus, by burning three of the four fuses, only the decoder with the non-burned fuse will operate to provide a logic high signal (upon receiving the correct CE0/CE1 logic combination).

Figure 29:
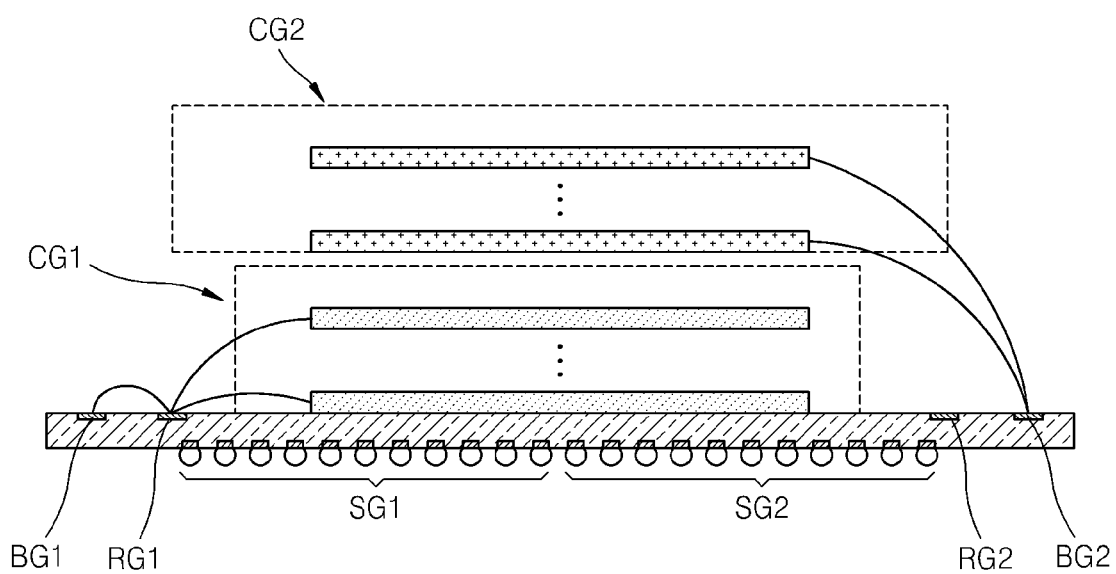
FIG. 29 is a cross-section view of yet another exemplary MCP.

FIG. 29 illustrates an alternative MCP having multiple sets of package substrate bonding pads. The MCP in FIG. 29 employs both of the electrical connection schemes shown in FIG. 10 and FIG. 12. Specifically, chips of chip group CG1 are directly connected to the package bonding pads (e.g. RG1); and the pads are electrically connected to the corresponding bonding pads (e.g. BG1). Chips of chip group CG2 are directly connected to the bonding pads (e.g. BG2); and the bonding pads are electrically connected to the corresponding bonding pads (e.g. RG2). The above hybrid connection scheme can be useful when chips have different sizes, such as the top chips are larger than the bottom chips.

Figure 30:
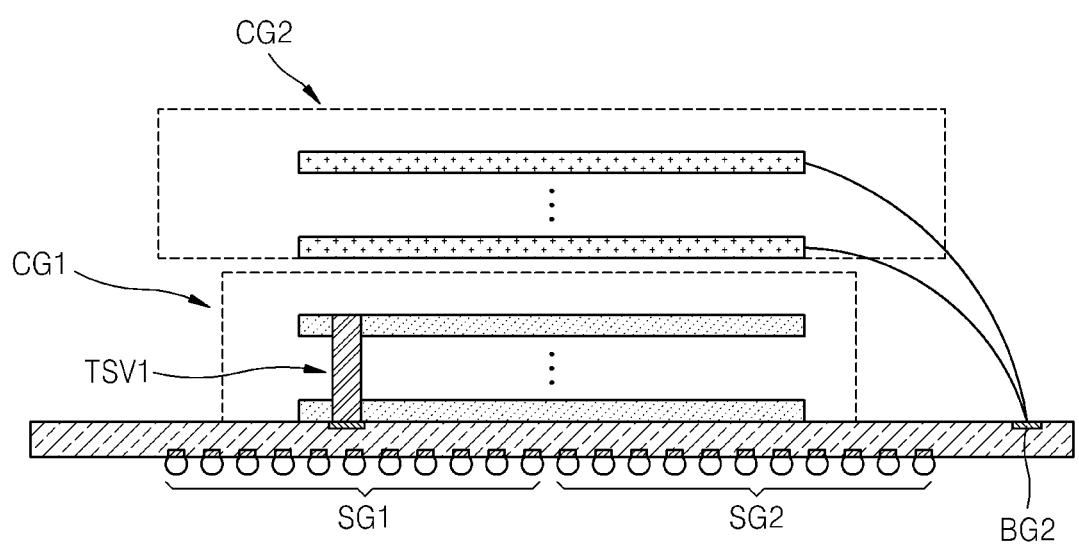
FIG. 30 is a cross-section view of yet another exemplary MCP.

Some of the wire bonding in FIG. 29 can be replaced by TSVs, as illustrated in FIG. 30. Referring to FIG. 30, chips of the lower chip group CG1 can be connected by using TSVs in the same way as that illustrated in FIG. 8. The chip of the upper chip group CG2 can be connected to the corresponding bonding pads using wires.

Although few embodiments of an example of this disclosure have been illustrated and described, it would be appreciated by those skilled in the art that changes may be made in these embodiments without departing from the principles and spirit of the invention. The foregoing embodiments are therefore to be considered in all respects illustrative rather than limiting on the invention described herein. The scope of the invention is thus indicated by the appended claims rather than by the foregoing description, and all changes which come within the meaning and range of equivalency of the claims are intended to be embraced therein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc. In addition, exemplary diagrams illustrate various methods in accordance with embodiments of the present disclosure. Such exemplary method embodiments are described herein using and can be applied to corresponding apparatus embodiments, however, the method embodiments are not intended to be limited thereby.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

As used in this disclosure, the term "preferably" is non-exclusive and means "preferably, but not limited to."

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Terms in the claims should be given their broadest interpretation consistent with the concepts set forth in this description. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "having" and "including", derivatives thereof and similar transitional terms or phrases are used synonymously with "comprising" (i.e., all are considered "open ended" terms)—only the phrases "consisting of" and "consisting essentially of" should be considered as "close ended". As used herein, the singular forms "a," "an" and "the" are intended to include the plural forms as well, unless the context clearly indicates otherwise. Similarly, use of the word "one" does not contemplate exclusion of others unless otherwise set forth in the claims.

Claims are not intended to be interpreted under 112 sixth paragraph unless the phrase "means for" and an associated function appear in a claim and the claim fails to recite sufficient structure to perform such function.

We claim:

1. A multichip package comprising:
   a substrate;
   a plurality of chips mounted to a first surface of the substrate, the plurality of chips comprising a first chip group of plural chips and a second chip group of plural chips;
   a ball grid array attached to a second surface of the substrate providing communication terminals of the package, the ball grid array comprising a first ball group and a second ball group;
   a first set of electrical connections to transmit at least one of signals and power, the first set of electrical connections connecting the first ball group to the first chip group;
   a second set of electrical connections to transmit at least one of signals and power, the second set of electrical connections connecting the second ball group to the second chip group,
   wherein at least one of the individual balls of the first ball group has an electrical connection of the first set of electrical connections to a signal terminal of one chip of the first chip group and to a signal terminal of a different chip of the first chip group,
   wherein at least one of the individual balls of the second ball group has an electrical connection of the second set of electrical connections to a signal terminal of one chip of the second chip group and to a signal terminal of a different chip of the second chip group, and
   wherein the first ball group is dedicated to the first chip group and the second ball group is dedicated to the second chip group.

2. The package of claim 1, wherein the first chip group has no electrical connections with the second chip group within the package.

3. The package of claim 1, wherein package terminals to transmit signals and power between an exterior of the package and the first chip group are limited to balls of the first ball group, and wherein package terminals to transmit signals and power between an exterior of the package and the second chip group are limited to balls of the second ball group.

4. The package of claim 1, wherein balls of the first ball group include a first ball, the first ball being electrically connected to a chip enable terminal of only one chip of the package, and wherein balls of the second ball group include a second ball, the second ball being electrically connected to a chip enable terminal of only another chip of the package.

5. The package of claim 1, wherein balls of the first ball group include a first ball and a second ball, the first ball electrically connected to chip enable pads of a first subset of chips of the first chip group, the second ball connected to chip enable pads of a second subset of chips of the first chip group, chip enable pads of the second subset being different from chip enable pads of the first subset.

6. The package of claim 1, further comprising:
   a third ball group, and
   a third set of electrical connections connecting the third ball group to chips of the first chip group and chips of the second chip group.

7. The package of claim 1, wherein the first set and second set of electrical connections do not include any electrical connections within any of the chips within the package.

8. The package of claim 1, wherein the first set of electrical connections connects individual balls of the first ball group to pads of the first chip.

9. The package of claim 1, wherein the first ball group has no direct electrical connections to the second ball group within the package.

10. The package of claim 1, wherein the first ball group includes all package terminals that transmit signals or power between an exterior of the package and the first chip group, and wherein the second ball group includes all package terminals that transmit signals or power between an exterior of the package and the second chip group.

11. The package of claim 10, wherein each ball of the first ball group is line symmetric with a corresponding ball of the second ball group having a same function with the corresponding ball of the second ball group.

12. The package of claim 1, wherein the first set of electrical connections comprises a first set of landing pads on the same side of the package as the pads of the first chip group and aligned side-by-side with the pads of the first chip group when viewed from a top-down view; and wherein the second set of electrical connections comprises a second set of landing pads on the same side of the package as the pads of the second chip group and aligned side-by-side with the pads of the second chip group when viewed from a top-down view.

13. The package of claim 12,
   wherein the first set of electrical connections comprises a first set of wire bonds connecting pads of the first chip group to the first set of landing pads and wherein the second set of electrical connections comprises a second set of wire bonds connecting pads of the second chip group to the second set of landing pads
   wherein the first set of wire bonds are substantially parallel to each other when viewed from a top-down view, and the second set of wire bonds are substantially parallel to each other when viewed from a top-down view.

14. The package of claim 12, further comprising:
   a third set of landing pads on the same side of the package as the first set of landing pads and electrically connected to the first set of landing pads; and
   a fourth set of landing pads on the same side of the package as the second set of landing pads and electrically connected to the second set of landing pads.

15. The package of claim 14, wherein the third set of landing pads is not aligned side-by-side with the pads of the first chip group when viewed from a top-down view, and the fourth set of landing pads is not aligned side-by-side with the pads of the second chip group when viewed from a top-down view.

16. The package of claim 14, wherein the first set of landing pads and second set of landing pads are configured to be connected to a first type of chip, and the third set of landing pads and fourth set of landing pads are configured to be connected to a second type of chip.

17. The package of claim 1, wherein the first chip group is in a stack with the second chip group and chips of the first chip group are interleaved with chips of the second chip group.

18. The package of claim 17, wherein the chips of the first chip group and second chip group are stacked in a zig-zag fashion.

19. The package of claim 17, wherein the first and second chip groups have equal number of chips and every chip of the first chip group but one is sandwiched between chips of the second chip group and every chip of the second chip group but one is sandwiched between chips of the first chip group.

20. The package of claim 17, wherein a first line intersects centers of all chips of the first chip group and a second line, offset from the first line, intersects centers of all chips of the second chip group.

21. The package of claim 20, wherein the first line is parallel to the second line.

22. The package of claim 17, wherein a first line intersects centers of all chips of the first chip group and all chips of the second chip group.

23. The package of claim 22, wherein edges of the chips of the first and second chip groups are aligned.

24. The package of claim 23, further comprising a layer of adhesive interposed between each pair of adjacent chips of the stack.

25. The package of claim 24, wherein the first and second set of electrical connections include wire bonds connecting to chip pads on the surfaces of the chips of the stack.

26. The package of claim 17, wherein the first set of electrical connections includes a first through-chip via through multiple chips of the stack, and the second set of electrical connections includes a second through-chip via through multiple chips of the stack.

27. The package of claim 26, wherein the first through-chip via passes through chips of the first chip group and the second chip group, but only transfers one or more of signals and power to or from chips of the first chip group, and the second through-chip via passes through chips of the first chip group and the second chip group, but only transfers one or more of signals and power to or from chips of the second chip group.

28. The package of claim 26, wherein the first through-chip via passes through pads of chips of the first chip group and pads of chips of the second chip group, but only transfers one or more of signals and power to or from chips of the first chip group, and the second through-chip via passes through pads of chips of the first chip group and pads of chips of the second chip group, but only transfers one or more of signals and power to or from chips of the second chip group.

29. The package of claim 26, wherein the first through-chip via passes through pads of chips of the first chip group and dummy pads of chips of the second chip group, but only transfers one or more of signals and power to or from chips of the first chip group, and the second through-chip via passes through dummy pads of chips of the first chip group and pads of chips of the second chip group, but only transfers one or more of signals and power to or from chips of the second chip group.

30. The package of claim 26, wherein the first through-chip via passes through pads of chips of the first chip group and test pads of chips of the second chip group, but only transfers one or more of signals and power to or from chips of the first chip group, and the second through-chip via passes through test pads of chips of the first chip group and pads of chips of the second chip group, but only transfers one or more of signals and power to or from chips of the second chip group.

31. The package of claim 26, wherein the first through-chip via passes through pads of chips of the first chip group and test pads of chips of the second chip group, and the second through-chip via passes through test pads of chips of the first chip group and pads of chips of the second chip group.

32. The package of claim 1, wherein the plurality of chips further comprise a third chip group of plural chips and the ball grid array further comprises a third ball group, and further comprising:
   a third set of electrical connections connecting the third ball group to the third chip group, wherein the plurality of chips are in a stack such that a first line intersects centers of all chips of the first chip group, a second line, offset from the first line, intersects centers of all chips of the second chip group, and a third line, offset from the first line and the second line, intersects centers of all chips of the third chip group.

* * * * *